United States Patent
Munakata

(10) Patent No.: US 8,348,255 B2
(45) Date of Patent: Jan. 8, 2013

(54) DISK HOLDING APPARATUS AND DEFECT/FOREIGN MATERIAL DETECTING APPARATUS

(75) Inventor: Teruyoshi Munakata, Ibaraki (JP)

(73) Assignees: Is Technology Japan, Inc., Tsukuba-shi (JP); Raytex Corporation, Tama-shi (JP)

(*) Notice: Subject to any disclaimer, the term of this patent is extended or adjusted under 35 U.S.C. 154(b) by 734 days.

(21) Appl. No.: 12/518,677

(22) PCT Filed: Dec. 13, 2007

(86) PCT No.: PCT/JP2007/074027
§ 371 (c)(1),
(2), (4) Date: Jun. 11, 2009

(87) PCT Pub. No.: WO2008/072694
PCT Pub. Date: Jun. 19, 2008

(65) Prior Publication Data
US 2010/0025908 A1 Feb. 4, 2010

(30) Foreign Application Priority Data
Dec. 14, 2006 (JP) .................... 2006-336988

(51) Int. Cl.
*B23Q 1/64* (2006.01)
(52) U.S. Cl. .......... 269/57; 269/68; 269/71; 269/85; 269/55; 269/58
(58) Field of Classification Search ............ 269/57, 269/68, 71, 85, 55, 58, 216; 294/1.1, 106; 118/730, 500; 279/4.12, 106, 119
See application file for complete search history.

(56) References Cited

U.S. PATENT DOCUMENTS
3,892,419 A * 7/1975 Jackson et al. ............ 279/4.12
(Continued)

FOREIGN PATENT DOCUMENTS
JP 11 354617 12/1999
(Continued)

OTHER PUBLICATIONS
Extended European Search Report issued Aug. 12, 2011, in European Patent Application No. 07850547.6.
(Continued)

Primary Examiner — George Nguyen
(74) Attorney, Agent, or Firm — Oblon, Spivak, McClelland, Maier & Neustadt, L.L.P.

(57) ABSTRACT

A disc holding apparatus including a plurality of movable holding claws, which have a holding section abutting to the outer circumference of a wafer having a notch and are arranged in the circumference direction of the wafer. The wafer is held by having each holding section on the inner edge side of each movable holding claw abut to the outer circumference of the wafer, thereby, at the time of detecting the notch by a sensor including a light source and a light receiving section, even when one of the holding sections abuts to the outer circumference of the wafer at a part where the notch exists, light from the light source is permitted to enter the light receiving section through the notch without being blocked by the holding section. Even when the wafer is held at the part where the notch exists, the wafer is not required to be correctly held again and throughput is improved with a shortened process time.

15 Claims, 16 Drawing Sheets

U.S. PATENT DOCUMENTS

| | | | |
|---|---|---|---|
| 4,788,994 A * | 12/1988 | Shinbara | 134/157 |
| 5,031,547 A * | 7/1991 | Hirose | 108/140 |
| 5,851,041 A * | 12/1998 | Anderson et al. | 294/106 |
| 5,916,366 A * | 6/1999 | Ueyama et al. | 118/52 |
| 5,954,072 A * | 9/1999 | Matusita | 134/149 |
| 5,988,191 A * | 11/1999 | Duncan | 134/149 |
| 6,167,893 B1 * | 1/2001 | Taatjes et al. | 134/147 |
| 6,273,484 B1 * | 8/2001 | Peng | 294/86.4 |
| 6,368,049 B1 * | 4/2002 | Osaka et al. | 414/783 |
| 6,761,362 B2 * | 7/2004 | Noguchi | 279/106 |
| 6,827,093 B2 * | 12/2004 | Muster et al. | 134/153 |
| 7,284,760 B2 * | 10/2007 | Siebert et al. | 279/4.12 |
| 7,354,481 B2 | 4/2008 | Okuno et al. | |
| 7,735,710 B2 * | 6/2010 | Kurita et al. | 228/49.4 |
| 7,748,760 B2 * | 7/2010 | Kushida et al. | 294/213 |
| 7,866,058 B2 * | 1/2011 | Kim et al. | 34/381 |
| 7,922,440 B2 * | 4/2011 | Du Bois et al. | 414/754 |
| 2002/0064450 A1 * | 5/2002 | Coomer et al. | 414/939 |
| 2006/0054082 A1 | 3/2006 | Okuno et al. | |

FOREIGN PATENT DOCUMENTS

| | | |
|---|---|---|
| JP | 2004-303796 | 10/2004 |
| JP | 2005 203661 | 7/2005 |
| JP | 2006 222190 | 8/2006 |

OTHER PUBLICATIONS

Office Action issued Apr. 13, 2012, in Japanese Patent Application No. 2008-549357 with English translation.

* cited by examiner

DISK HOLDING APPARATUS AND DEFECT/FOREIGN MATERIAL DETECTING APPARATUS

TECHNICAL FIELD

The present invention relates to a disk holding apparatus for holding and positioning a disk such as a silicon wafer and a defect/particle detecting apparatus for detecting adherence of particles and defects on a surface, a back surface and an outer circumference.

BACKGROUND ART

Conventionally, there is known a wafer holding apparatus for performing alignment of the center position and direction of a wafer placed by a wafer transfer robot (for example, see patent document 1). Such a conventional holding as disclosed in this patent document is provided with a plurality of slide arms (holding mechanisms) opened or closed in the wafer center direction, each of the slide arms having a claw at an outer edge for holding an outer circumference of the wafer.
[Patent Document 1] Japanese Patent Application Laid-open No. 2006-222190

DISCLOSURE OF THE INVENTION

Problem to be Solved by the Invention

Silicon wafers (hereinafter referred to as "wafer") have the direction where they are easy to cleave (crystal orientation). In order to indicate the direction (crystal orientation), generally a notch is made in the wafer. The notch is positioned as a reference of dicing direction of the wafer and as a reference position of each processing step. Besides, this notch is used as a reference to identify a part of defect. As the notch thus serves as a mark (reference position), the notch has to be detected. If the notch direction (position) is not identified, it becomes difficult to mark a defect part (marking on the image).

Meanwhile, in the above-described conventional holding apparatus and a defect/particle detecting apparatus for detecting adherence of foreign materials and defects on the outer circumference and the front and back surfaces of the wafer, as the claw at the outer edge of each of the plural slide arms is used to hold the outer circumference of the wafer, the following problems are presented.

(1) The plural slide arms are positioned at the lower surface side of the wafer. If they hold a notch part of the wafer, they are placed over the notch, the notch is hidden behind the slide arms and the notch's position can not be detected. For example, the outer circumference of the wafer is irradiated with light from a light source and the light is detected by a photodetector. If the wafer is held at the notch part, the light is blocked by the holding part of the slide arm and the incident light intensity on the photodetector becomes week, resulting in error determination that there exists no notch. That is, the notch can not be detected. In other words, if a larger part (area) of the notch is hidden by the slide arms, a detection value detected by the photodetector becomes smaller than a threshold value and the notch position can not be detected though the notch exists actually.

(2) When the notch part of the wafer is held, it becomes necessary for the holding part of each slide arm to re-hold the wafer so that it holds a part other than the notch part to be able to detect the notch with incident light. Hence, detecting of the notch consumes much time and shows decrease in throughput.

(3) The plural slide arms are positioned to the lower surface side of the wafer. When images of respective surfaces of the wafer are taken to obtain surface information, the image of one surface (front surface) is first taken, then the wafer is turned around and the image of the other surface (back surface) is taken. Much time is needed for taking both surfaces of one wafer.

The present invention was carried out in view of such conventional problems, and has an object to provide a disk holding apparatus and a defect/particle detecting apparatus capable of surely detecting the position of a notch even if they hold a notch part of the disk, improving detection throughput and enabling image-pickup of both surfaces simultaneously.

Means for Solving the Problem

In order to solve the above-mentioned problems, a disk holding apparatus according to a first aspect of the present invention is a disk holding apparatus comprising: a plurality of movable holding claws arranged uniformly spaced in a circumferential direction of a disk with a notch, each of the movable holding claws having a holding part formed to an inner end side of the disk and abutting to an outer circumference of the disk; and a movable claw driving unit for moving each of the movable holding claws in a radial direction passing through a center of the disk between a holding position where the holding part of the movable holding claw abuts to the outer circumference of the disk and a release position where the holding part goes away from the outer circumference.

According to this aspect, the holding part on the inner end side of each of the plural movable holding claws holds the disk by abutting to the outer circumference of the disk. When the sensor comprised of the light source and the light receiving part is used to detect the notch, if the holding part of any of the movable holding claws abuts to the outer circumference of the disk at the notch portion, the light from the light source is able to pass through the notch into the light receiving part without being blocked by the holding part. With the structure of the present invention, it is possible to prevent the notch from being hidden by the movable holding claw thereby to detect the notch position with reliability, though in the above-mentioned related art, when the wafer is held at the notch portion, a large part of the notch is hidden by the slide arm and the notch cannot be detected.

Even when the disk is held at a notch portion, it is possible to eliminate the need to re-hold the disk or change the relative position of the holding parts of the movable holding claws thereby to shorten the processing time and to improve the throughput. Further, as there is only a small area in the front surface and back surface of the disk which is hidden by the holding part of each of the plural movable holding claws, it is possible to use the cameras provided for image-taking the front and back surfaces of the disk to take images of both of the surfaces of the disk simultaneously.

The "disk" used here includes a disk-shaped object such as a silicon wafer, a mask and the like.

A disk holding apparatus according to a second aspect of the present invention is characterized in that the holding part of each of the movable holding claws is formed in such a way that while the holding part abuts to the outer circumference of the disk and the disk is held by the movable holding claws, the disk is held in a horizontal plane and the center of the disk agrees with a rotational center of the disk.

According to this aspect, it is possible to rotate the plural movable holding claws and the disk together with the center of the disk in the horizontal plane as a rotational center, while the disk is held by the plural movable holding claws. This makes it possible to hold the disk by the movable holding claws with reliability without undulation or deformation of the disk that is shown in the vacuum attachment.

A disk holding apparatus according to a third aspect of the present invention is characterized in that the holding part of each of the movable holding claws has a concave surface abutting to an upper edge and a lower edge of the outer circumference of the disk.

According to this aspect, as the disk is held by the concave surface of the holding part of each of the plural movable holding claws abutting to the upper edge and lower edge of the outer circumference of the disk, it is possible to hold the disk with reliability.

A disk holding apparatus according to a fourth aspect of the present invention is characterized in that the holding part of each of the movable holding claws has a V-shaped tapered surface abutting to an upper part and a lower part of the outer circumference of the disk.

According to this aspect, as the V-shaped tapered surface of each holding part abuts to the upper part and the lower part of the outer circumference of the disk to hold the disk, it is possible to hold the disk with reliability.

A disk holding apparatus according to a fifth aspect of the present invention is characterized by further comprising: an inner ring rotatably supported by a board; an outer ring rotatably supported by the inner ring; and a rotation driving unit for rotating the inner ring, the movable claw driving unit rotating the outer ring relative to the inner ring in normal and reverse directions so that the each of the movable holding claws moves between the holding position and the release position.

According to this aspect, as the movable claw driving unit moves each movable holding claw between the holding position and the release position by rotating the outer ring relative to the inner ring in the normal and reverse directions, the driving part of the movable claw driving unit can be placed outside the inner ring and the outer ring. This makes it possible to hold and rotate the disk without preventing the cameras from taking images of both surfaces of the disk. That is, if the driving part for rotating each of the movable holding claws is provided on the movable part like the inner ring or outer ring (rotating side), there occur problems such as complicated wiring, kink or break in the wire and the like. In order to prevent these problems, it is required to rotate the disk back to the original state or to put limitations on the rotation amount. The present invention makes it possible to eliminate such inconvenience and realize a simple structure.

A disk holding apparatus according to a sixth aspect of the present invention is characterized in that the rotation driving unit has a driving source, a pulley rotatably supported by the board to be integral with the inner ring, and a belt for transferring rotation of the driving source to the pulley.

A disk holding apparatus according to a seventh aspect of the present invention is characterized in that the movable holding claws are biased outwardly in the radial direction by a first spring, the movable claw driving unit has: a lever rotatably supported on the outer ring in such a manner that an end of the lever abuts to an outer end of a corresponding one of the movable holding claws; a second spring, provided between an opposite end of the lever and a fixation pin provided on the outer ring, for biasing the movable holding claw inwardly in the radial direction by a biasing force stronger than a biasing force of the first spring; a connecting unit for connecting the inner ring and the outer ring and controlling a relative rotation angle of the inner ring and the outer ring; and a relative rotation generating unit for rotating the inner ring and the outer ring relative to each other.

A disk holding apparatus according to an eighth aspect of the present invention is characterized in that the connecting unit controls an angle for rotating the outer ring relative to the inner ring in the normal and reverse directions between a first position where the one end of the lever presses the movable holding claw to hold the movable holding claw at the holding position and a second position where pressure of the movable holding claw by the one end of the lever is released to hold the movable holding claw at the release position.

According to this aspect, when the connecting unit is placed in the first position, the movable holding claws are pressed by the one ends of the respective levers and held in the holding position. When the connecting unit is placed in the second position, the movable holding claws are released from pressure of the one ends of the respective levers and held in the release position. With this structure, it is possible to hold the movable holding claws in the holding position steadily when the connecting part is placed in the first position and to hold the movable holding claws in the release position steadily when the connecting part is placed in the second position.

A disk holding apparatus according to a ninth aspect of the present invention is characterized in that the connecting unit has: a lever rotatably supported by the inner ring; a rotation transferring member provided on the outer ring and engaging with the lever so as to transfer normal rotation and reverse rotation of the outer ring relative to the inner ring to the lever.

A disk holding apparatus according to a tenth aspect of the present invention is characterized in that the lever comprises a plurality of levers, and the disk holding apparatus further comprises a release unit for, during one turn of the movable holding claws together with the inner ring and the outer ring while the disk is held by the movable holding claws abutting to the outer circumference of the disk, engaging with the levers one after another to release pressure of the movable holding claws by the levers and displace the movable holding claws from the holding position to the release position sequentially.

According to this aspect, when the front surface and back surface of the disk are image-taken by the cameras or when the upper edge and upper side ("hereinafter referred to as "edge upper part") and the lower edge and lower side ("hereinafter referred to as "edge lower part") of the disk are image-taken by the edge detection sensors, it is possible to obtain image information of any cracks, scratches, adhesion of particles and the like in each of the parts of the disk held by the holding parts of the plural movable holding claws by the cameras or edge detection sensors.

Further, for a disk having a small notch (for example, the notch is so small that the notch is hidden behind the movable holding claws), even if a movable holding claw abuts to the outer circumference of the disk at a notch portion, the movable holding claw is in the state of the release position, the light from the light source is not blocked by the holding part and made to pass through the notch into the light receiving part. This structure makes it possible to detect the position of the notch with reliability.

A disk holding apparatus according to an eleventh aspect of the present invention is characterized in that the relative rotation generating unit has a second driving source arranged around the outer ring and a friction belt rotating by a driving force of the second driving source, and the friction belt is brought into contact with an outer circumference of the outer ring thereby to rotate the outer ring relative to the inner ring in normal and reverse directions.

According to this aspect, the second driving source of the relative rotation generating unit for generating relative rotation of the outer ring and inner ring is arranged outside the outer ring. When the driving part is arranged inside the rotating object there occur problems such as complicated wiring, kink or break in the wire and the like. In order to prevent these problems, it is required to rotate the disk back to the original state or to put limitations on the rotation amount. The present invention makes it possible to prevent such inconvenience and realize a simple structure.

A disk holding apparatus according to a twelfth aspect of the present invention is characterized in that the relative rotation generating unit has a second driving source arranged around the outer ring, a gear rotating by driving of the second driving source, and a ring gear fixed to an outer circumference of the outer ring, and the gear is engaged with the ring gear thereby to rotate the outer ring relative to the inner ring in normal and reverse directions.

According to this aspect, the second driving source of the relative rotation generating unit is arranged outside the outer ring. When the driving part is arranged inside the rotating object there occur problems in the wire, complicated wiring and the like and there is a need to rotate the disk back to the original state. The present invention makes it possible to realize a simple structure free from such inconvenience and problems. Besides, the second driving source of the relative rotation generating unit for rotating the outer ring relative to the inner ring in the normal and reverse directions is arranged outside the outer ring. When the driving part is arranged inside the rotating object there occur problems in the wire, complicated wiring and the like and there is a need to rotate the disk back to the original state. The present invention makes it possible to realize a simple structure free from such inconvenience and problems.

A disk holding apparatus according to a thirteenth aspect of the present invention is characterized by further comprising a wafer table movable upward and downward between a support position for supporting a back surface of the disk transferred from outside and a save position positioned therebeneath.

According to this aspect, as the wafer table is provided for supporting the back surface of the disk which is to be transferred into the disk holding apparatus from the outside by a wafer transferring robot or the like, it is possible to move the plural movable holding claws inwardly in the radial direction while the disk is supported by the wafer table thereby to be able to hold the outer circumference of the disk by the holing parts of the respective movable holding claws with safety.

A defect/particle detecting apparatus according to a first aspect of the present invention is a defect/particle detecting apparatus comprising: the disk holding apparatus according to the above-described aspect; a plurality of cameras arranged at positions capable of image-taking a front surface and a back surface of the disk; and a detecting part for using image information taken by the cameras to detect any defect or adhesion of particle on the front surface and the back surface of the disk.

According to this aspect, it is possible to bring about the same effects of the disk holding apparatus according to the above-mentioned aspects of the present invention. In addition, it is possible to take images of the front surface and the back surface of the disk simultaneously with use of plural cameras. Further, as the holding parts of the movable holding claws are abutted to the outer circumference of the disk to hold the disk, it is possible to rotate the disk while holding the disk without preventing the cameras from taking images of the both surfaces of the disk. Furthermore, in taking images of the both surfaces of the disk with the cameras, the above-mentioned related art has low throughput because the front surface of the disk is image-taken by the cameras, the disk is reversed and then, the back surface of the disk is image-taken. On the other hand, according to this aspect, it is possible to shorten the time of taking image information of the both surfaces of the disk thereby to improve the throughput. Here, the camera is a generic name of those having a sensor function to obtain image information capable of judging defect such as crack and scratch and adherences of particle and the like on the both surfaces and on the outer circumference of the disk.

Further, in this aspect, the front surface and the back surface of the disk are image-taken simultaneously with use of one or plural cameras to obtain image information of the front and back surfaces of the disk. When taking images of the both surfaces of the disk with the cameras, as compared with the above-mentioned related art case where the front surface of the disk is image-taken by the cameras, the disk is reversed and then, the back surface of the disk is image-taken, it is possible in this aspect to shorten the time of taking image information of the front and back surfaces of the disk thereby to improve the throughput of processing step of detecting defect such as crack and scratch and adherences of particle and the like on the both surfaces of the disk by the obtained image information.

Furthermore, as the cameras are moved so that the image-taken areas in the front surface of the disk by the cameras are almost equal to each other, the information amount of images taken by the respective cameras are almost equal. This makes it possible to improve the throughput of processing step of detecting defect such as crack and scratch and adherences of particle and the like on the both surfaces of the disk by the obtained image information.

A defect/particle detecting apparatus according to a second aspect of the present invention is characterized by, in the defect/particle detecting apparatus of the first aspect of the present invention, further comprising: edge detecting units for image-taking an outer circumference of the disk; and a detecting part using image information of an upper edge and an upper part of the outer circumference of the disk taken by the edge detecting unit arranged to a front surface side and image information of a lower edge and a lower part of the outer circumference of the disk taken by the edge detecting unit arranged to a back surface side to detect any defect or adhesion of particle on the outer circumference of the disk.

According to this aspect, it is possible to take images of the edge upper part and the edge lower part of the disk simultaneously thereby to obtain image information of the edge upper part and the edge lower part of the disk. Further, it is possible to obtain not only the image information of the edge upper part and the edge lower part of the disk not held by holding parts of the movable holding claws, but also image information of the edge upper part and the edge lower part of the disk held by holding parts of the movable holding claws by taking images of the edge upper part and the edge lower part of the disk while the release unit is used to displace the movable holding claws to the release position. With this structure, it is possible to shorten the time of taking image information of the both surfaces of the disk thereby to improve the throughput of the processing of detecting defect such as crack and scratch and adherences of particle and the like on the outer circumference of the disk by the obtained image information.

Effects of the Invention

According to the disk holding apparatus of the first aspect of the present invention, the holding part on the inner end side of each of the plural movable holding claws holds the disk by abutting to the outer circumference of the disk. When the sensor comprised of the light source and the light receiving part is used to detect the notch, if the holding part of any of the movable holding claws abuts to the outer circumference of the disk at the notch portion, the light from the light source is able to pass through the notch into the light receiving part without being blocked by the holding part. In the above-mentioned related art, when the wafer is held at the notch portion, a large part of the notch is hidden by the slide arm and the notch cannot be detected. However, with the structure of the present invention, it is possible to prevent the notch from being hidden from the movable holding claw thereby to detect the notch position with reliability.

Even when the disk is held at a notch portion, it is possible to eliminate the need to re-hold the disk or change the relative position of the holding parts of the movable holding claws thereby to shorten the processing time and to improve the throughput. Further, as there is only a small area in the front surface and back surface of the disk which is hidden by the holding part of each of the plural movable holding claws, it is possible to use the cameras provided for image-taking the front and back surfaces of the disk to take images of both of the surfaces of the disk simultaneously.

Further, according to the disk holding apparatus of the second aspect of the present invention, it is possible to rotate the plural movable holding claws and the disk together with the center of the disk in the horizontal plane as a rotational center, while the disk is held by the plural movable holding claws. This makes it possible to hold the disk by the movable holding claws with reliability without undulation or deformation of the disk that is shown in the vacuum attachment.

Furthermore, according to the disk holding apparatus of the third aspect of the present invention, as the disk is held by the concave surface of the holding part of each of the plural movable holding claws abutting to the upper edge and lower edge of the outer circumference of the disk, it is possible to hold the disk with reliability.

Furthermore, according to the disk holding apparatus of the fourth aspect of the present invention, as the V-shaped tapered surface of each holding part abuts to the upper part and the lower part of the outer circumference of the disk to hold the disk, it is possible to hold the disk with reliability.

Furthermore, according to the disk holding apparatus of the fifth or sixth aspect of the present invention, as the movable claw driving unit moves each movable holding claw between the holding position and the release position by rotating the outer ring relative to the inner ring in the normal and reverse directions, the driving part of the movable claw driving unit can be placed outside the inner ring and the outer ring. This makes it possible to hold and rotate the disk without preventing the cameras from taking images of both surfaces of the disk. That is, if the driving part for rotating each of the movable holding claws is provided on the movable part like the inner ring or outer ring (rotating side), there occur problems such as complicated wiring, kink or break in the wire and the like. In order to prevent these problems, it is required to rotate the disk back to the original state or to put limitations on the rotation amount. The present invention makes it possible to eliminate such inconvenience and realize a simple structure.

Furthermore, according to the disk holding apparatus of the seventh, eighth or ninth aspect of the present invention, when the connecting unit is placed in the first position, the movable holding claws are pressed by the one ends of the respective levers and held in the holding position. When the connecting unit is placed in the second position, the movable holding claws are released from pressure of the one ends of the respective levers and held in the release position. With this structure, it is possible to hold the movable holding claws in the holding position steadily when the connecting part is placed in the first position and to hold the movable holding claws in the release position steadily when the connecting part is placed in the second position.

Furthermore, according to the disk holding apparatus of the tenth aspect of the present invention, when the front surface and back surface of the disk are image-taken by the cameras or when the edge upper part and edge lower part of the disk are image-taken by the edge detection sensors, it is possible to obtain image information of any cracks, scratches, adhesion of particles and the like in each of the parts of the disk held by the holding parts of the plural movable holding claws by the cameras or edge detection sensors.

Further, for a disk having a small notch (for example, the notch is so small that the notch is hidden behind the movable holding claws), even if a movable holding claw abuts to the outer circumference of the disk at a notch portion, the movable holding claw is in the state of the release position, the light from the light source is not blocked by the holding part and made to pass through the notch into the light receiving part. This structure makes it possible to detect the position of the notch with reliability.

Furthermore, according to the disk holding apparatus of the eleventh aspect of the present invention, the second driving source of the relative rotation generating unit for generating relative rotation of the outer ring and inner ring is arranged outside the outer ring. When the driving part is arranged inside the rotating object there occur problems such as complicated wiring, kink or break in the wire and the like. In order to prevent these problems, it is required to rotate the disk back to the original state or to put limitations on the rotation amount. The present invention makes it possible to prevent such inconvenience and realize a simple structure.

Furthermore, according to the disk holding apparatus of the twelfth aspect of the present invention, the second driving source of the relative rotation generating unit is arranged outside the outer ring. When the driving part is arranged inside the rotating object there occur problems in the wire, complicated wiring and the like and there is a need to rotate the disk back to the original state. The present invention makes it possible to realize a simple structure free from such inconvenience and problems. Besides, the second driving source of the relative rotation generating unit for rotating the outer ring relative to the inner ring in the normal and reverse directions is arranged outside the outer ring. When the driving part is arranged inside the rotating object there occur problems in the wire, complicated wiring and the like and there is a need to rotate the disk back to the original state. The present invention makes it possible to realize a simple structure free from such inconvenience and problems.

Furthermore, according to the disk holding apparatus of the thirteenth aspect of the present invention, as the wafer table is provided for supporting the back surface of the disk which is to be transferred into the disk holding apparatus from the outside by a wafer transferring robot or the like, it is possible to move the plural movable holding claws inwardly in the radial direction while the disk is supported by the wafer table thereby to be able to hold the outer circumference of the disk by the holing parts of the respective movable holding claws with safety.

In addition, the defect/particle detecting apparatus of the first aspect of the present invention exerts the same effects of the disk holding apparatus according to any one of the above-mentioned aspects.

Further, it is possible to take images of the front surface and the back surface of the disk simultaneously with use of one or plural cameras. Furthermore, the holding parts of the movable holding claws are abutted to the outer circumference of the disk to hold the disk, it is possible to rotate the disk while holding the disk without preventing the cameras from taking images of the both surfaces of the disk. Furthermore, in taking images of the both surfaces of the disk with the cameras, as compared with the conventional case where the front surface of the disk is image-taken by the cameras, the disk is reversed and then, the back surface of the disk is image-taken thereby to obtain image information of the front and back surfaces of the disk, it is possible to shorten the time of taking image information of the both surfaces of the disk thereby to improve the throughput of the processing of detecting defect such as crack and scratch and adherences of particle and the like on the both surfaces of the disk by the obtained image information.

Furthermore, according to the defect/particle detecting apparatus of the second aspect of the present invention, it is possible to take images of the edge upper part and the edge lower part of the disk simultaneously thereby to obtain image information of the edge upper part and the edge lower part of the disk. Further, it is possible to obtain not only the image information of the edge upper part and the edge lower part of the disk not held by holding parts of the movable holding claws, but also image information of the edge upper part and the edge lower part of the disk held by holding parts of the movable holding claws by taking images of the edge upper part and the edge lower part of the disk while the release unit is used to displace the movable holding claws to the release position. With this structure, it is possible to shorten the time of taking image information of the both surfaces of the disk thereby to improve the throughput of the processing of detecting defect such as crack and scratch and adherences of particle and the like on the outer circumference of the disk by the obtained image information.

EXPLANATION OF SYMBOLS

Figure 1:
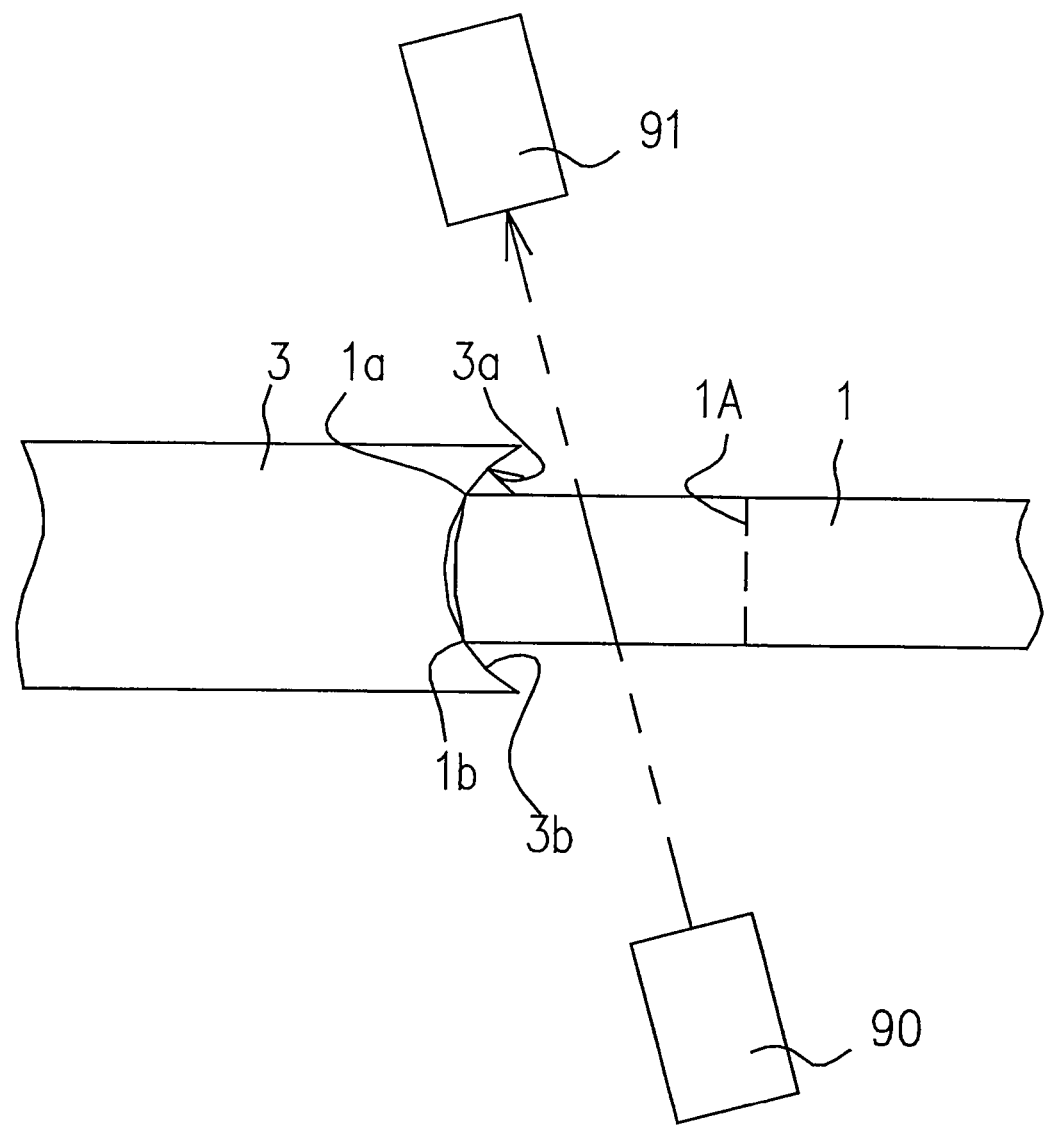
FIG. 1 is an explanatory view showing the outer circumference of a wafer held by the holding part of a movable holding claw in the disk holding apparatus according to a first embodiment.

1 . . . wafer (disk)
1A . . . notch
1*a* . . . upper edge
1*b* . . . lower edge
1*c* . . . upper part
1*d* . . . lower part
2 . . . movable claw driving part (movable claw driving unit)
3 . . . movable holding claw
3*a* . . . holding part
3*b* . . . concave surface
3*c* . . . V-shaped tapered surface
3*d* . . . outer end
4 . . . board
5 . . . inner ring 6 . . . outer ring
7 . . . rotation driving part (rotation driving unit)
8 . . . motor (driving source)
9 . . . pulley
10 . . . steel belt (belt)
11 . . . first spring
12 . . . lever
12a . . . one end
12b . . . the opposite end
12c . . . rotational center
12d . . . base end
13 . . . fixation pin
14 . . . second spring
15 . . . connecting part (connecting unit)
16,16A . . . relative rotation generating part (relative rotation generating unit)
17 . . . connecting lever
17a . . . tip end of connecting lever
18 . . . engaging pin
19 . . . rotation transferring member
20 . . . fixation pin
21 . . . spring pin
22,22A . . . release part (release unit)
23 . . . motor (second driving source)
24 . . . first pulley
25 . . . O ring (friction belt)
26 . . . second pulley
27 . . . wafer table
27a . . . support surface
30 . . . pulley
31 . . . engaging member
31a . . . engaging surface
32 . . . air cylinder
33 . . . linear guide
61 . . . ring gear
62 . . . gear
63 . . . motor
64 . . . air cylinder
71-73 . . . camera

BEST MODE FOR CARRYING OUT THE INVENTION

With reference to the drawings, embodiments of the present invention will be described in detail below. In the following description, like parts are denoted by like reference numerals and explanation thereof will be omitted here.

First Embodiment

Description here is about a disk holding apparatus according to the first embodiment and a defect/particle detecting apparatus provided with the disk holding apparatus, with reference to FIGS. 1 to 12.

Figure 2:
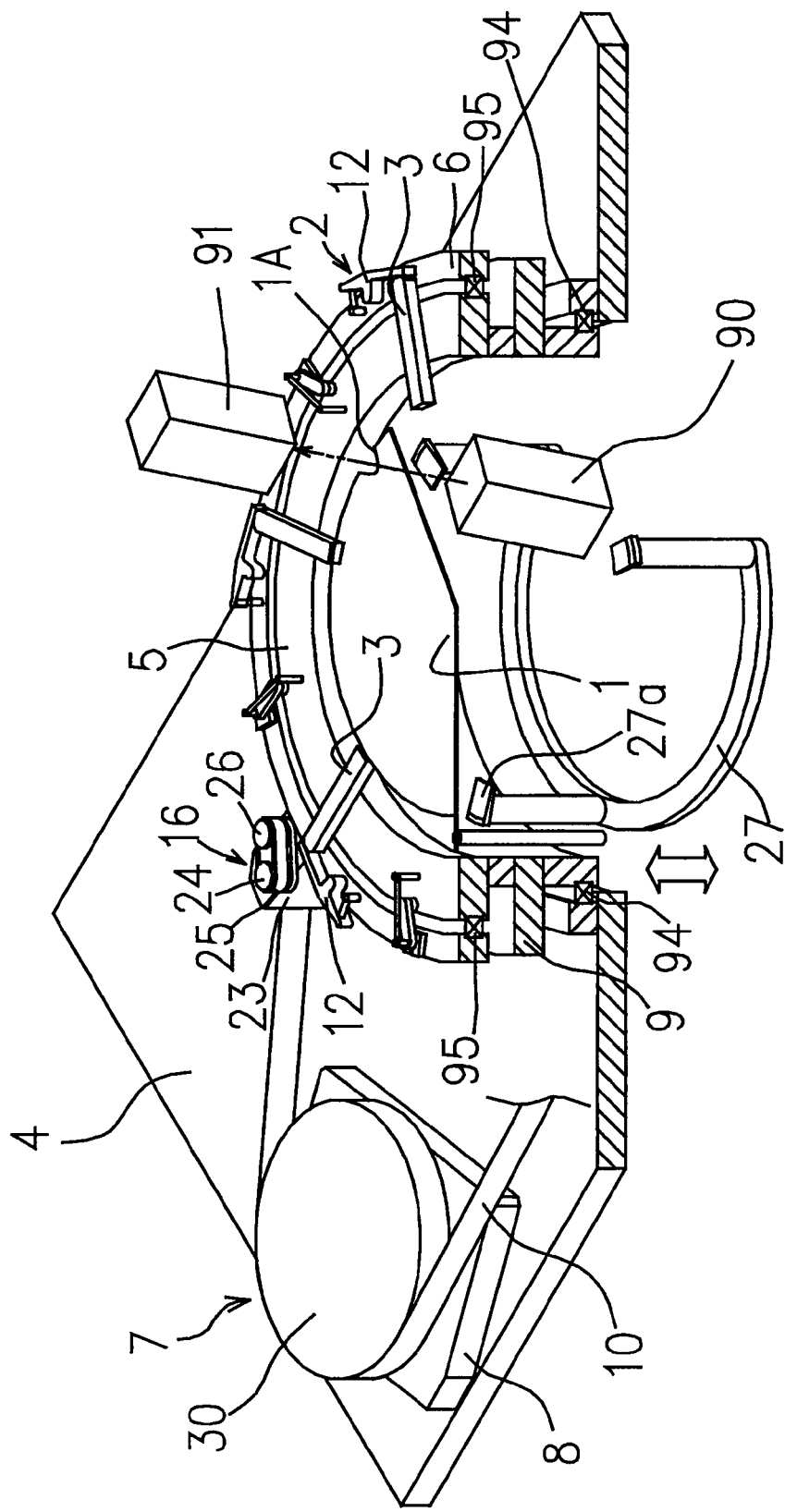
FIG. 2 is a schematic structural view showing the entire disk holding apparatus according to the first embodiment, in which the disk holding apparatus is partially shown in cross section.
Figure 3:
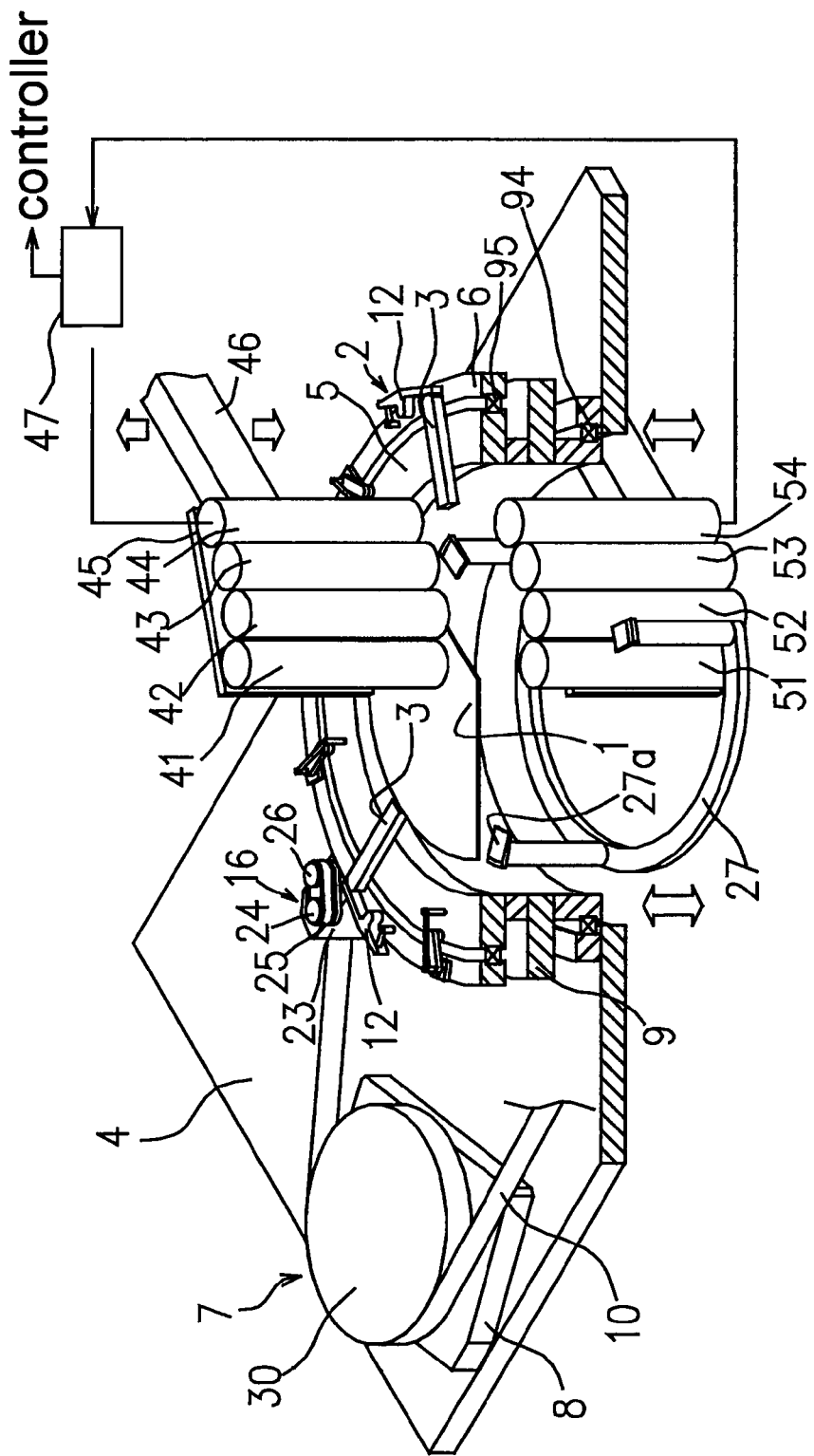
FIG. 3 is a schematic structural view showing the entire disk holding apparatus according to the first embodiment, in which the disk holding apparatus is partially shown in cross section.

This disk holding apparatus has, as shown in FIGS. 1 and 2, a plurality of movable holding claws 3 arranged evenly-spaced on the circumference of a disk-shaped wafer 1 having a notch 1A, each having a holding part 3a that abuts to the outer circumference of the wafer 1. In this example, six movable holding claws 3 are provided (see FIG. 4). Besides, the disk holding apparatus has movable claw driving parts 2 as movable claw driving unit for moving the respective movable holding claws 3 in the diameter direction passing through the center of the wafer 1 (wafer 1 radial direction) between the holding position and the release position as shown in FIGS. 1 to 3.

Here, the holding position is, as shown in FIGS. 1 and 10(A), the position where the holding part 3a of each movable claw 3 abuts to and holds (clamps) the wafer 1. In addition, the release position is the position where the holding part 3a goes away from the outer circumference of the wafer 1 to release the wafer 1.

Further, the disk holding apparatus is provided with a notch detection sensor for detecting the position of a notch 1A by emitting light from the back surface side of the wafer to the outer circumference of the wafer 1 as shown in FIGS. 1 and 2. This notch detection sensor has a light source 90 provided to the back surface side of the wafer 1 for emitting laser light or the like and a light receiving part 91 for receiving the laser light from the light source 90. This notch detection sensor is structured to detect the position and the presence or absence of the notch 1A by comparing a value of photoelectric output of this light receiving part 91 with a threshold value. The light source 90 and the light receiving part 91 form edge detecting unit. The edge detecting unit may be formed of cameras instead of the light source 90 and the light receiving part 91 and structured to detect an edge based on the image data taken by the cameras.

The wafer 1 is held by the plural movable holding claws 3 while the holding part 3a of each of the plural movable holding claws 3 abuts to the outer circumference of the wafer 1 so that the wafer 1 is held in the horizontal plane and the center of the wafer 1 agrees with the rotational center of the wafer 1. Specifically, as shown in FIG. 1, the holding part 3a of each of the movable holding claws 3 has a concave surface 3b abutting to the lower edge 1b and the upper edge 1a of the outer circumference of the wafer 1. In addition, if the holding part 3a of any of the movable holding claw abuts to the outer circumference of the wafer 1 at a portion where the notch 1A exists, the light from the light source 90 passes through the notch 1A into the light receiving part 91 without being blocked by the holding part 3a.

Besides, the disk holding apparatus has, as shown in FIGS. 2 to 6, a board 4, an inner ring 5 rotatably held by the board 4, an outer ring 6 rotatably held by the inner ring 5 via a bear ring 95 (see FIG. 6), and a rotation driving part 7 as rotation driving unit for driving the inner ring 5.

The rotation driving part 7 has, as shown in FIGS. 2 to 6, a motor 8 as driving source, a pulley 9 rotatably supported by the board 4 and fixed to the lower part of the inner ring 5, a pulley 30 rotated by the motor 8 and arranged coaxially with the output shaft of the motor 8, and a steel belt 10 provided around the pulleys 9 and 30 and transferring rotation of the pulley rotated by the motor 8 to the pulley 9. When the motor 8 is rotated, the rotation driving part 7 transfers this rotation via the pulley 30, the steel belt 10 and the pulley 9 so that the inner ring 5 integral with the pulley 9 is rotated.

Figure 6:
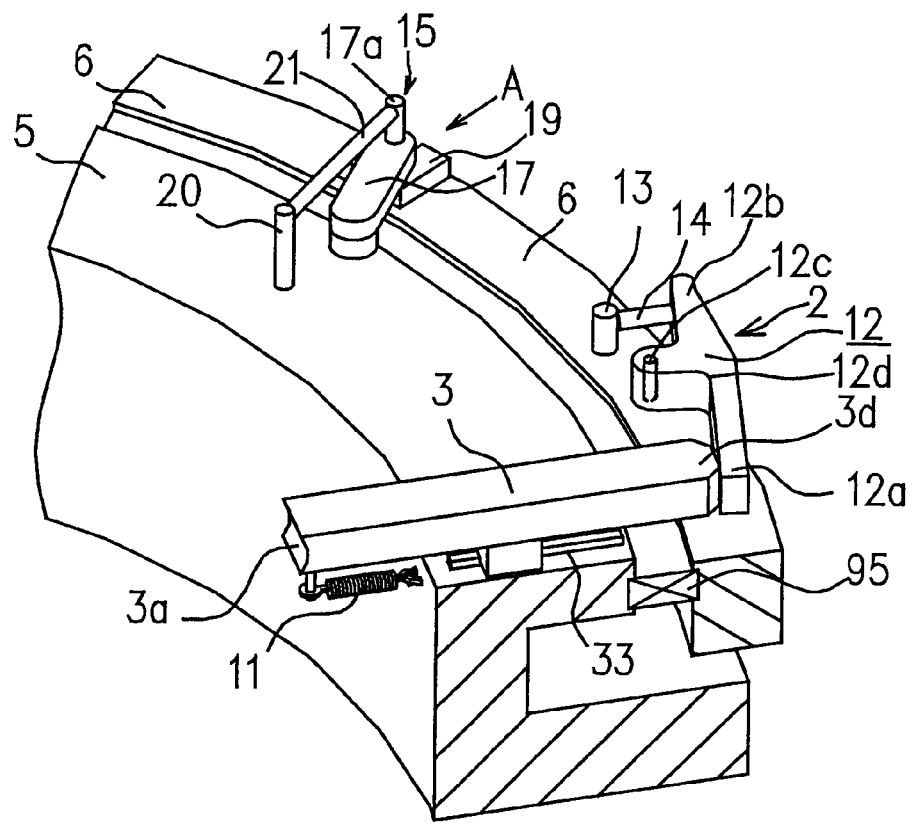
FIG. 6 is an exploded perspective view, in which a part of the structure of FIG. 4 is shown in cross section.

The plural movable holding claws 3 move straightly in the wafer 1 radial direction by a linear guide 33 arranged on the upper surface of the inner ring 5, as shown in FIG. 6. In addition, the plural movable holding claws 3 are biased by the first spring 11 (see FIG. 6) outward in the wafer 1 radial direction (toward the above-mentioned release position). In FIG. 6, each movable holding claw 3 is biased toward the radial center of the wafer 1 by the movable claw driving part 2 and positioned in the holding position displaced inwardly in the wafer 1 radial direction against the biasing force of the first spring 11.

The movable claw driving part 2 is structured, as shown in FIGS. 2 to 6, to rotate the inner ring 5 and outer ring 6 relative to each other and move a corresponding movable holding claw 3 between the holding position and the release position. In this embodiment, the movable claw driving part 2 rotates the outer ring 6 normally or reverse the outer ring 6 relative to the inner ring 5 within a predetermine angle range to move the movable holding claw 3 between the holding position and the release position.

This movable claw driving part 2 has a lever 12 rotatably supported on the outer ring 6. As shown in FIG. 6, one end 12*a* of each lever 12 abuts to the outer end 3*d* of the corresponding movable holding claw 3. Further, the movable claw driving part 2 has a fixation pin 13 and a second spring 14 provided on the outer ring 6 corresponding to the lever 12. The second spring 14 is provided between the fixation pin 13 and the opposite end 12*b* of the lever 12 so that the movable holding claw 3 can be biased inwardly in the wafer 1 radial direction by a biasing force that exceeds the biasing force of the first spring 11 via the lever 12.

In FIG. 6, each movable holding claw 3 is positioned in the above-mentioned holding position where it is displaced inwardly in the wafer 1 radial direction against the biasing force of the first spring 11. The end 12*a* of the lever 12 abuts to the outer end 3*d* of the movable holding claw 3 and the movable holding claw 3 is held in the holding position by the biasing force of the second spring 14 against the biasing force of the first spring 11.

Further, the movable claw driving part 2 has a connection part 15 connecting the inner ring 5 and the outer ring 6 and controlling the rotation angle of the outer ring 6 relative to the inner ring 5 (the relative rotation angle range of the outer ring 6 to the inner ring 5). Furthermore, the movable claw driving part 2 has a relative rotation generating part 16 (see FIG. 2) as relative rotation generating unit for generating rotation of the outer ring 6 relative to the inner ring 5 (relative rotation of the outer ring 6 and inner ring 5).

The connecting part 15 is structured to enable relative rotation of the outer ring 5 and the inner ring 6 between the first position where the end 12*a* of each lever 12 presses the outer end 3*d* of the corresponding movable holding claw 3 to hold the movable holding claw 3 in the holding position (position shown in FIGS. 6 and 10(A)) and the second position where pressure of the movable holding claw 3 by the end 12*a* is released to hold the movable holding claw 3 in the release position (see FIG. 10(C)).

Figure 7:
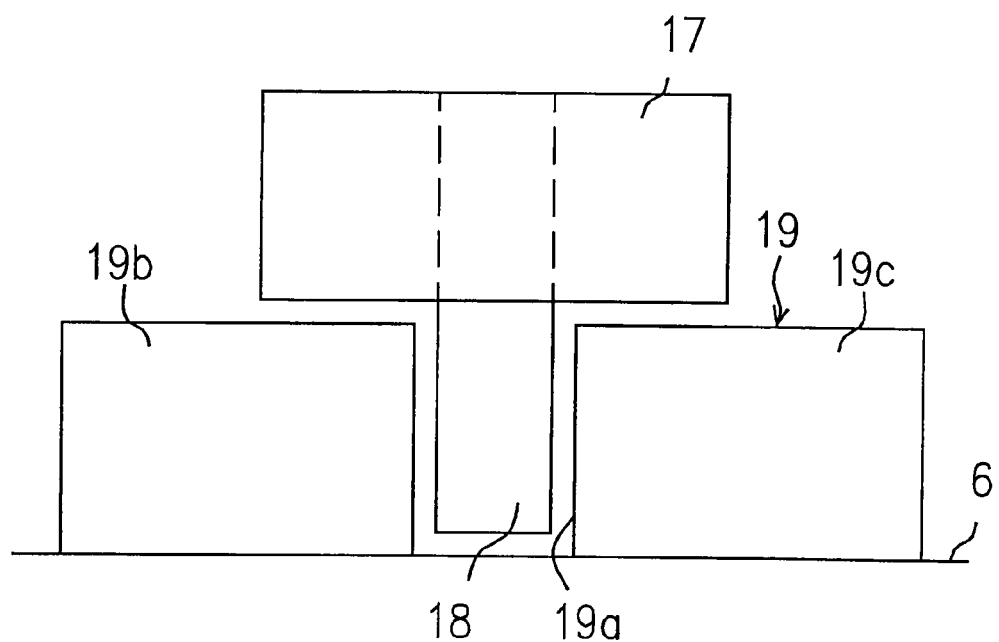
FIG. 7 is a conceptual view showing a connecting lever and a rotation connecting member in the direction of the arrow A in FIG. 6, in which the front end (end to the arrow A side) of the connecting lever and the rotation connecting member is only shown the tip end of the connecting bar jutting onto the upper part of the connecting lever is omitted.
Figure 8:
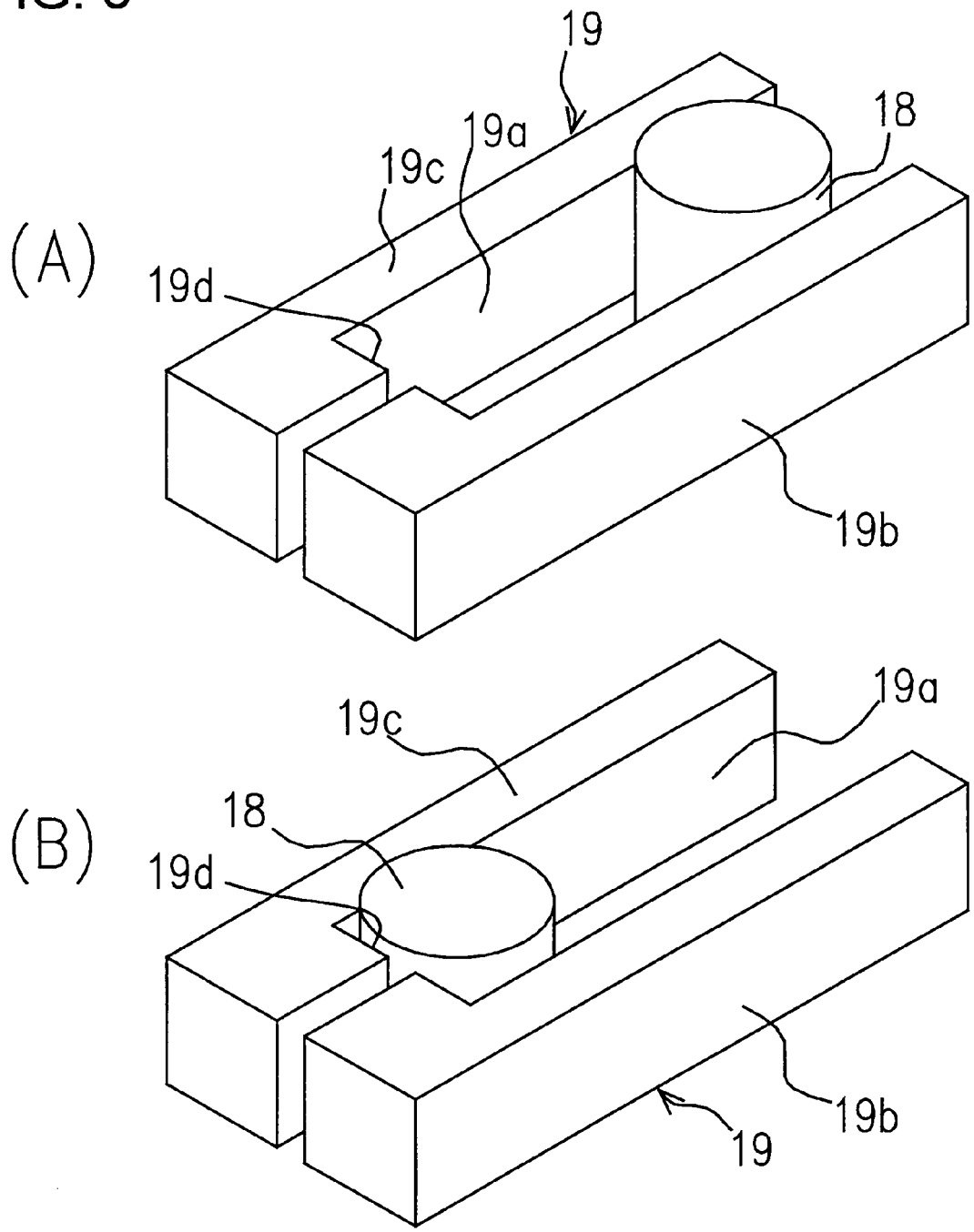
FIG. 8(A) is an operation explanatory view showing the engaging part of the engaging pin and the engaging groove when the connecting part is in the intermediate position.
FIG. 8(B) is an operation explanatory view showing the engaging part of the engaging pin and the engaging groove when the connecting part is in the first and second positions.
Figure 9:
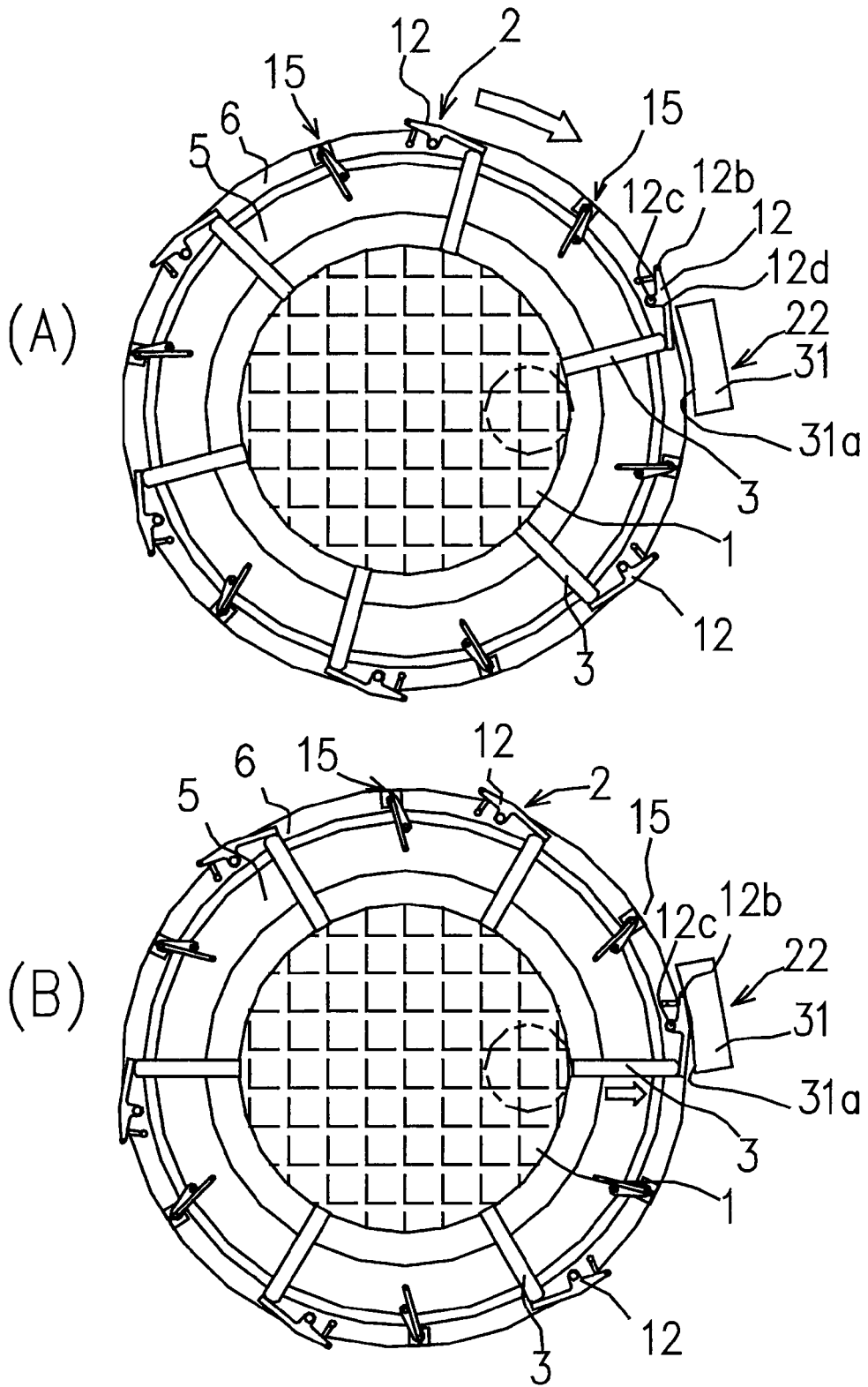
FIG. 9(A) is an operation explanatory view showing the release part approaching the lever of the movable claw driving part.
FIG. 9(B) is an operation explanatory view showing the release part engaging with the lever.
Figure 10:
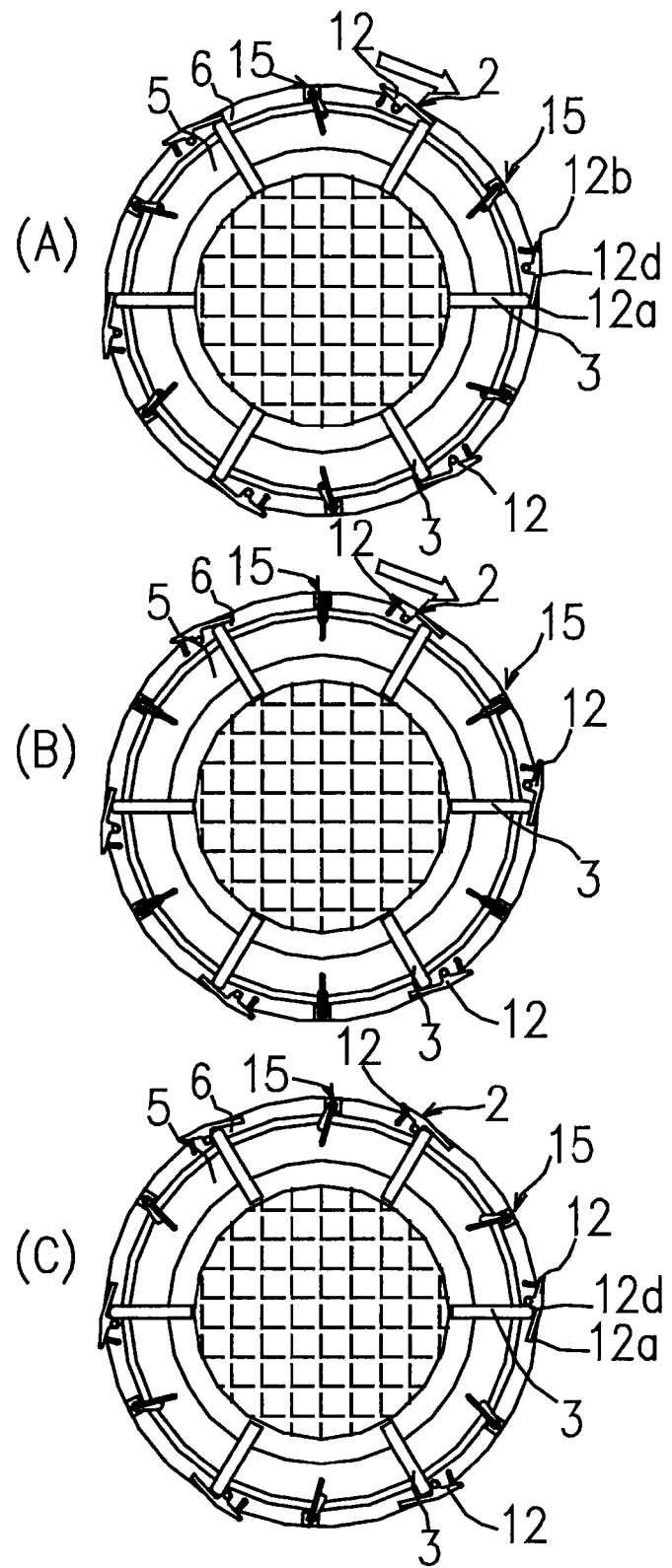
FIG. 10(A) is an operation explanatory view showing the connecting part in the first position.
FIG. 10(B) is an operation explanatory view showing the connecting part in the intermediate position.
FIG. 10(C) is an operation explanatory view showing the connecting part in the second position.

The connecting part 15 has, as shown in FIGS. 6 to 8, a connecting lever 17 rotatably fixed to the inner ring 5, and a rotation transferring member 19 provided on the outer ring 6 and engaging with an engaging pin 18 integral with the connecting lever 17 so as to normal rotation and reverse rotation of the outer ring 6 to the connecting lever 17. The rotation transferring member 19 has a groove forming member 19*b* and a groove forming member 19*c* which form an engaging groove 19*a*. In this example, the groove forming member 19*b* and the groove forming groove 19 are independent from each other, however, the groove forming member 19*b* and the groove forming groove 19 may be formed into one piece to form the engaging groove 19*a*. The engaging pin 18 engages with this engaging groove 19*a* of the rotation transferring member 19, and the normal rotation or reverse rotation of the outer ring 6 relative to the inner ring 5 is transferred to the connecting lever 17 via the engaging part of the engaging pin 18 and the engaging groove 19*a* of the rotation transferring member 19.

In addition, the connecting part 15 has a third spring 21 provided the tip end 17*a* of the connecting lever 17 and the fixation pin 20 provided on the inner ring 5. This third spring 21 is used to give a biasing force into the first position shown in FIG. 10(A) and the second position shown in FIG. 10(C) in accordance with the rotation angles of the outer ring 6 relative to the inner ring 5.

That is, in the first position shown in FIGS. 6, 8(B) and 10(A), the connecting part 15 holds the rotation angle position of the outer ring 6 relative to the inner ring 5 in such a manner that the one end 12*a* of each lever 12 presses the outer end 3*d* of the corresponding movable holding claw 3 to hold the movable holding claw 3 at the holding position. At this first position, in order to prevent the outer ring 6 from rotating further in the counterclockwise direction from the first position shown in FIGS. 6, 8(B) and 10(A), the engaging pin 18 integral with the connecting lever 17 and the engaging groove end 19*d* of the rotation transferring member 19 abut to limit the rotation. At the same time, as the engaging pin 18 is pressed to this position by the biasing force of the third spring 21 (biased to rotate in the counterclockwise direction), the position of the outer ring 6 relative to the inner ring 5 is held in the first position. That is, the connecting part 15 has both of the function of maintaining the relative rotation position of the outer ring 6 relative to the inner ring 5 at the first position shown in FIGS. 8(B) and 10(A) and the rotation limit function (stopper function) of preventing the outer ring 6 from rotating from the first position further in the counterclockwise direction.

In addition, when the outer ring 6 is rotated in the clockwise direction from the position shown in FIGS. 6, 8(B) and 10(A) by a relative rotation generating part 16 described later, the connecting lever 17 of the connecting part 15 exceeds the dead position (midpoint shown in FIGS. 8(A) and 10(B)) and reaches the second position shown in FIGS. 8(B) and 10(C). When the outer ring 6 rotates in the clockwise direction and the connecting lever 17 exceeds the dead position, the third spring 21 biases the outer ring 6 in such a manner that the outer ring 6 rotates in the clockwise direction. When the outer ring 6 moves from the first position to the second position, the engaging pin 18 performs piston movement or moves in the engaging groove 19*a* from the position of FIG. 8(B) to the position 8(A) (dead position) and then, return to the position of FIG. 8(B).

Hence, also at the second position, in order to prevent the outer ring 6 from rotating further in the clockwise direction from the second position shown in FIGS. 8(B) and 10(C), the engaging pin 18 integral with the connecting lever 17 and the engaging groove end 19*d* of the rotation transferring member 19 abut to limit the rotation. At the same time, as the engaging pin 18 is pressed to this position by the biasing force of the third spring 21 (biased to rotate in the clockwise direction), the position of the outer ring 6 relative to the inner ring 5 is held in the second position. That is, the connecting part 15 has both of the function of maintaining the relative rotation position of the outer ring 6 relative to the inner ring 5 at the second position shown in FIGS. 8(B) and 10(C) and the rotation limit function (stopper function) of preventing the outer ring 6 from rotating from the second position further in the clockwise direction.

Further, the disk holding apparatus has a release part 22 as release unit shown in FIGS. 9(A) and 9(B). While the holding parts 3*a* (see FIGS. 1 and 6) abut to the outer circumference of the wafer 1 to hold the wafer 1 and the movable holding claws 3 rotate together with the inner ring 5 and the outer ring by one turn, the release part 22 engages the plural levers 12 one after another and releases pressure of the movable holding claws 3 by the respective levers 12 sequentially to displace the movable holding claws 3 to the release position one after another. In this example, the release part 22 is comprised of an engaging member 31 fixed to a support or the like on the board (see FIG. 12).

This engaging member 31 is arranged in such a manner that an engaging surface 31*a* of the engaging member 31 is placed inside the rotation track of opposite ends 12b of the levers 12. During one rotation of each of the movable holding claws 3 together with the inner ring 5 and the outer ring 6, the engaging surface 31a of the engaging member 31 engages with the opposite end 12b of each of the levers 12 sequentially. With this engagement, the lever 12 rotates in the counterclockwise direction around the rotational center 12C against the biasing force of the second spring 14 from the position shown in FIGS. 6 and 9(A), the pressure is the corresponding movable holding claw 3 by the lever 12 is removed and the movable holding claw 3 at the holding position is displaced to the release position sequentially.

As shown in FIGS. 2 to 5, the relative rotation generating part 16 has a motor 23 as a second driving source arranged outside of the outer ring 6 on the board 4, a first pulley 24 connected to the output shaft of the motor 23 and rotating by its driving force, a second pulley 26 supported rotatably and rotating around the rotational center of the first pulley 24 by the rotation of the motor 23 and an O ring (friction belt) 25 provided on and around the pulleys 24 and 26.

Figure 4:
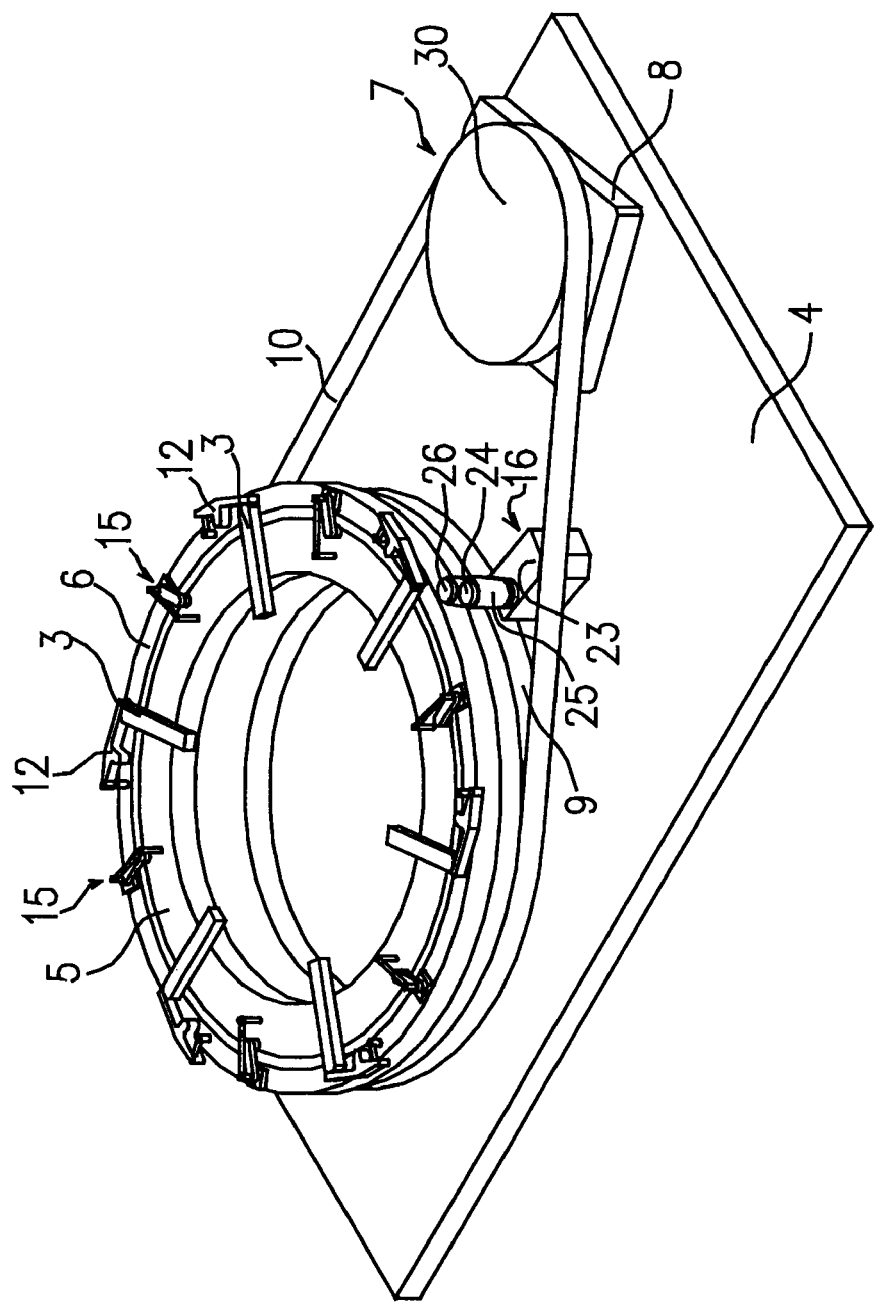
FIG. 4 is a perspective view showing the entire disk holding apparatus, in which a part of the structure is omitted and the O ring of the relative rotation generating part abuts to the outer ring.
Figure 5:
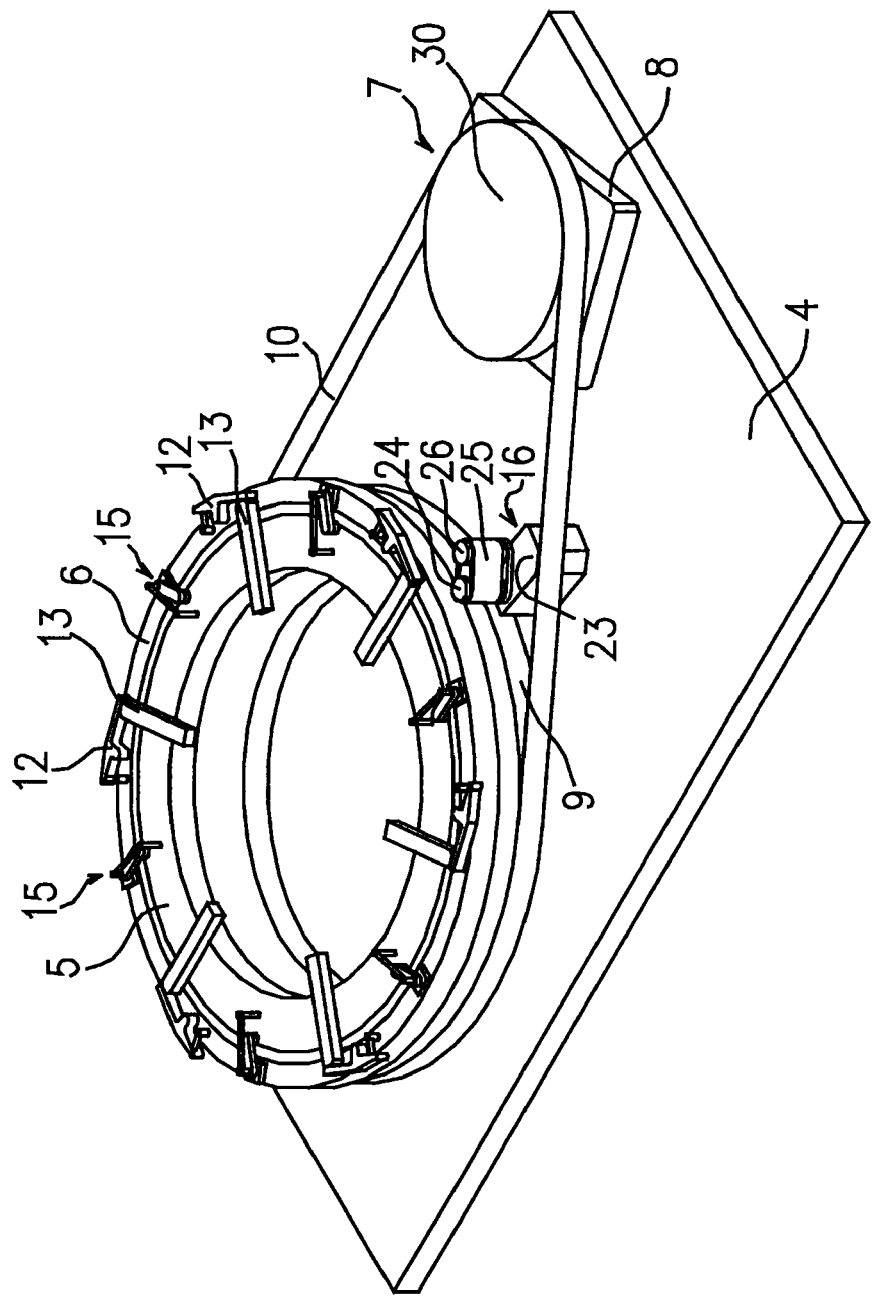
FIG. 5 is a perspective view like FIG. 4, showing the O ring of the relative rotation generating part goes away from the outer ring.

In the relative rotation generating part 16, when the motor 23 is rotated in the reverse direction in FIG. 2 and the first pulley 24 is rotated in the reverse direction (counterclockwise direction in FIG. 2) while the connecting part 15 is in the first position shown in FIG. 10(A) and each movable holding claw 3 is in the holding position, the second pulley 26 and the O ring 25 abut to the outer circumference of the outer ring 6 as shown in FIG. 4. Then, the rotation (reverse rotation) of the O ring 25 is transferred to the outer ring 6 and the outer ring 6 is rotated relative to the inner ring 5 in the clockwise direction from the position shown in FIG. 10(A), via the position shown in FIG. 10(B) to the position shown in FIG. 10(C).

Further, in the relative rotation generating part 16, when the motor 23 is rotated in the normal direction and the first pulley 24 is rotated in the normal direction (clockwise direction in FIG. 4) while the connecting part 15 is in the second position shown in FIG. 10(C) and each movable holding claw 3 is in the release position, the second pulley 26 and the O ring 25 rotate in the clockwise direction and the O ring 25 abuts to the outer circumference surface of the outer ring 6 as shown in FIG. 2. Then, the rotation (normal rotation) of the O ring 25 is transferred to the outer ring 6 and the outer ring 6 is rotated relative to the inner ring 5 in the counterclockwise direction from the position shown in FIG. 10(C), via the position shown in FIG. 10(B) to the position shown in FIG. 10(A).

In addition, the disk holding apparatus has, as shown in FIG. 2, a support position where the back surface of the wafer 1 transferred from the outside by the wafer transferring robot is supported by the supporting surface 27a (position shown in FIG. 2) and a wafer table 27 moved upward and downward by an air cylinder or the like (not shown) between the support position and the save position positioned therebeneath.

Figure 11:
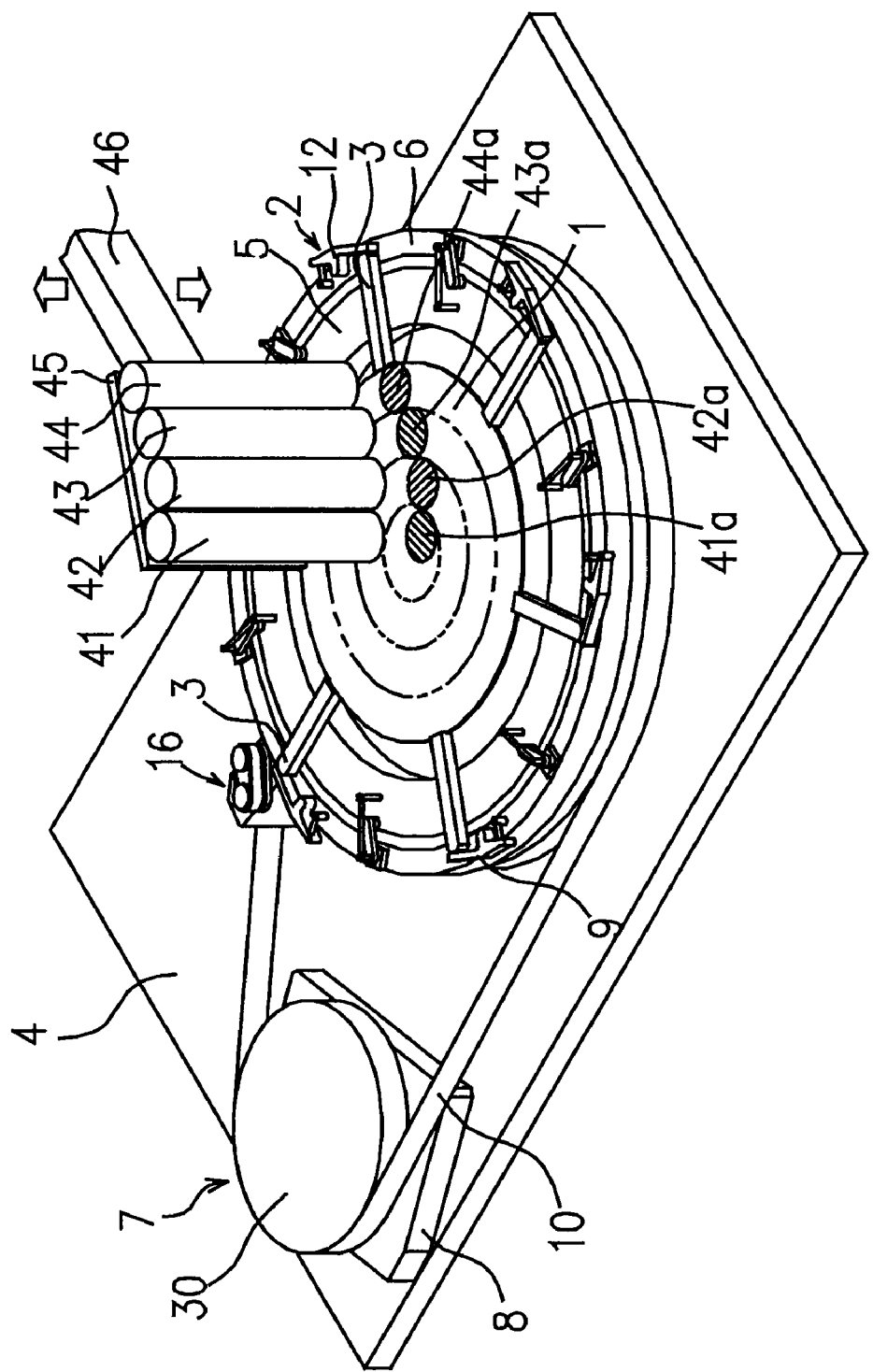
FIG. 11 is an explanatory view showing the wafer held by the plural movable holding claws is rotated and the front surface of the wafer is image-taken by four cameras.

Further, the disk holding apparatus has, as shown in FIGS. 3 and 11, plural cameras 41 to 44 (four cameras) and 51 to 54 (four cameras) (see FIG. 3) on the front surface side and back surface side, respectively, of the wafer 1. In this example, the four cameras 41 to 44 are fixed to the holding plate 45 and a stay 46 integral with this holding plate 45 is arranged on the board 4 movably upward and downward by the air cylinder or the line (not shown). With this structure, the four cameras 41 to 44 are able to move upward and downward without preventing placing of the wafer 1.

Further, the four cameras 41 to 44 are arranged, as shown in FIG. 11, to take images of the different spots 41a to 44a, respectively, on the front surface of the wafer 1 in the radial direction of the wafer 1. Like the cameras 41 to 44, the cameras 51 to 54 arranged to the back surface side of the wafer 1 are also arranged to take images of the different spots on the back surface of the wafer 1 in the radial direction of the wafer 1.

Figure 12:
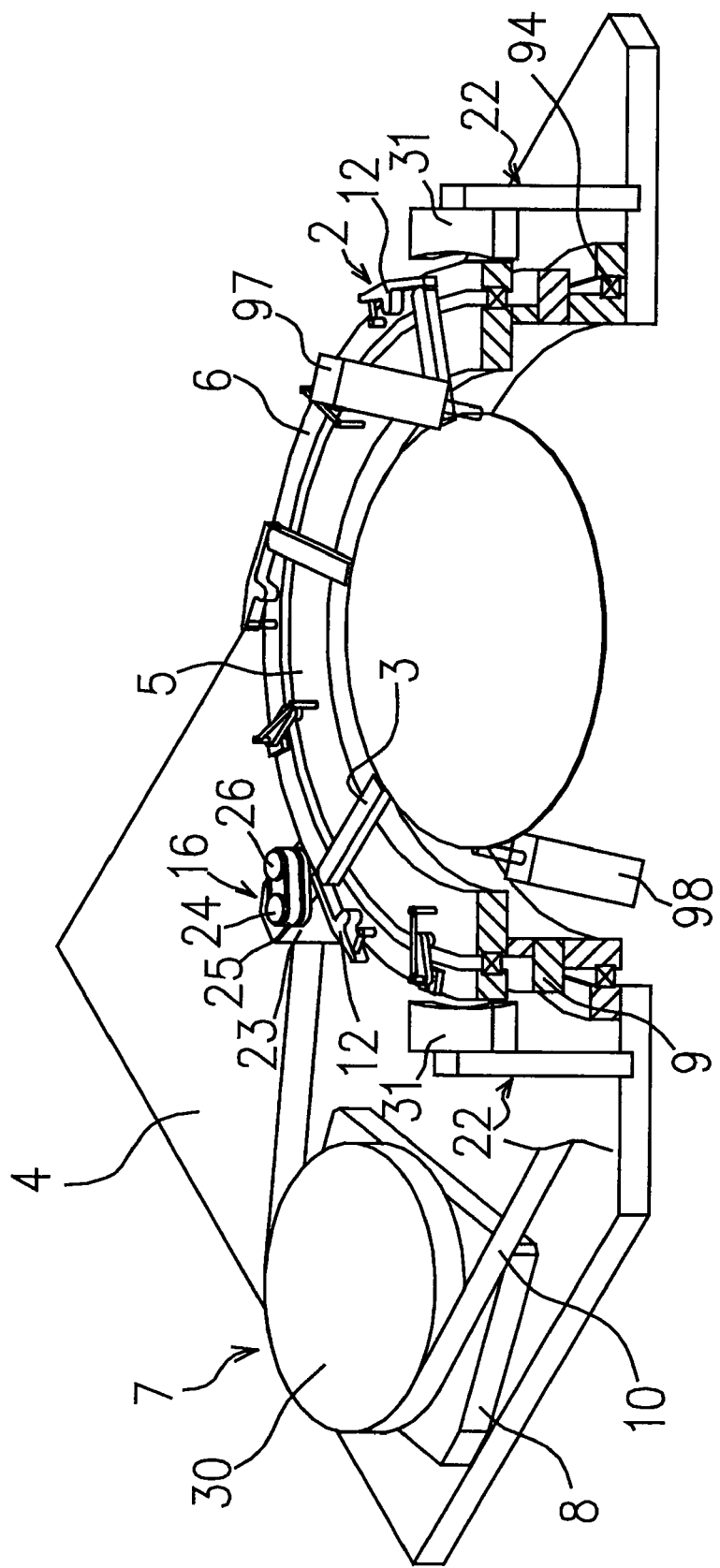
FIG. 12 is a schematic structural view showing the entire disk holding apparatus according to a second embodiment, in which the disk holding apparatus is partially shown in cross section.

Further, the disk holding apparatus has, as shown in FIG. 12, edge detection sensors 97 and 98 arranged on the front surface side and the back surface side, respectively, of the wafer 1. The edge detection sensor 97 is arranged to take image of the upper part of the edge area of the wafer 1 from obliquely upper and outer side of the upper edge 1a of the wafer 1, while the edge detection sensor 98 is arranged to take images of the lower part of the edge area of the wafer from the obliquely lower and outer side of the lower edge 1b of the wafer 1. The edge detection sensors 97 and 98 are arranged to take images of the outer circumference of the wafer 1 held by the holding parts of the movable holding claws 3 while the movable holding claws 3 are displaced to the release position by the holding release part 22. Here, in this example, the edge detection sensors 97 and 98 are arranged to take images at the positions 180-degree shifted in the outer circumference of the wafer 1. With this structure, the edge detection sensors 97 and 98 are able to take images of not only the wafer edge but also wafer side surface and periphery portion. In other words, the edge detection sensors 97 and 98 take images of some area by the spots but not take image of one point, and it is possible to examine a certain area of the edge side surface and its periphery.

In addition, the defect/particle detecting apparatus provided with the above-described disk holding apparatus according the first embodiment has a detecting part 47 and cameras 41 to 44 and 51 to 54, as shown in FIG. 3. In the first embodiment, the detecting part 47 and the cameras 41 to 44 and 51 to 54 form a detecting part for detecting defects and particles. The detecting part 47 is connected to the cameras 41 to 44 and 51 to 54 to obtain image information of the front surface and back surface of the wafer 1 taken by the cameras 41 to 44 and 51 to 54. The obtained information is used as a basis to perform image processing by an image analyzer (not shown) thereby to detect defects such as cracks, scratches or the like and adherences of particle.

Further, as the detecting part 47 of the defect/particle detecting apparatus provided with the disk holding apparatus according to the first embodiment is connected (not shown) to the edge detection sensors 97 and 98 shown in FIG. 12, it obtains the image information of the edge upper part and edge lower part of the wafer 1 taken by the edge detection sensors 97 and 98. The obtained information is used as a basis to be subjected to image processing by an image analyzer (not shown) thereby to detect defects such as cracks, scratches or the like and adherences of particle.

Next description is made about the operation of the disk holding apparatus having the above-described structure, with reference to FIGS. 9(A), 9(B), 10(A), 10(B) and 10(C).

Before the wafer 1 is transferred from the outside to the disk holding apparatus, the wafer table 27 is moved upward to the position shown in FIG. 2. Then, the connecting part 15 is in the second position shown in FIG. 10(C), the outer end 3d of each of the movable holding claws 3 is in the position where it abuts to the base end 12d of the corresponding lever (see FIG. 6) and the movable holding claw 3 is held in the release position shown in FIG. 10.

In this state, the wafer 1 is transferred from the outer side to the disk holding apparatus by the transfer robot to place the wafer 1 on the wafer table 27.

Next, the motor 23 of the relative rotation generating part 16 is rotated in the normal direction. With this rotation, when the first pulley 24 is rotated in the normal direction (clockwise direction in FIG. 4) while the connecting part 15 is in the second position shown in FIG. 10(C) and the movable holding claws 3 are in the release position, the second pulley 26 and the O ring 25 rotate in the clockwise direction around the rotational center of the first pulley 24 the O ring 25 abuts to the outer circumference surface of the outer ring 6 shown in FIG. 2. Then the rotation (normal rotation) of the O ring 25 is transferred to the outer ring 6 and the outer ring 6 rotate relative to the inner ring 5 in the counterclockwise direction from the position shown in FIG. 10(C), via the position shown in FIG. 10(B) to the position shown in FIG. 10(A). Then, the one end 12a of each lever 12 abuts to the outer end 3d of the corresponding movable holding claw 3 and the movable holding claw 3 is biased by the second spring 14 to move to the holding position as shown in FIG. 10(A). In this holding position, the connecting part 15 is in the first position and each movable holding claw 3 is held on the holding position by the connecting part 15.

Thus, the rotor 8 is rotated with the wafer 1 held by the movable holding claws 3, this rotation is transferred to the pulley 9 via the pulley 30 and steel belt thereby to rotate the movable holding claws 3 and the wafer 1 and the inner ring 5.

While the wafer 1 is rotating, the front and back surfaces of the wafer 1 are image-taken by the cameras 41 to 44 and the cameras 15 to 54. Here, in the defect/particle detecting apparatus, the information of the images taken is sent to the image analyzer to be subjected to image processing in which any defects such as crack, scratch or the like and adherences of particle in front and back surfaces of the wafer 1 (edge upper part and edge lower part) are detected.

Then, during one turn of the wafer 1, the release part 22 engages the levers 12 one after another as shown in FIG. 9(B) and releases of pressure of the movable holding claws 3 by the respective levers 12. The movable holding claws 3 in the holding position are sequentially displaced to the release position. Then, the movable holding claws 3 sequentially changed to the release position are displaced again to the holding position by the biasing force of the second spring 14 after passage of the release part 22.

Further, as, while the movable holding claws 3 are displaced to the release position, the edge upper part and the edge lower part of the outer circumference of the wafer 1 held by the movable holding claws 3 are image-taken by the edge detection sensors 97 and 98, the edge detection sensors 97 and 98 take images of the edge upper part and the edge lower part of entire circumference of the wafer 1 while the wafer 1 is rotated. Here, in the defect/particle detecting apparatus, the information of the images taken is sent to the image analyzer to be subjected to image processing in which any defects such as crack, scratch or the like and adherences of particle in the outer circumference of the wafer 1 (edge upper part and edge lower part) are detected.

When image taking of the front and the back surfaces of the wafer 1 by the cameras 41 to 44 and 51 to 54 and image taking the edger upper part and the edge lower part of the wafer 1 by the edge detecting sensors 97 and 98 are finished and the wafer 1 is removed from the disk holding apparatus, the motor 23 of the relative rotation generating part 16 is rotated in the reverse direction in FIG. 2 to rotate the first pulley 24 in the reverse direction (rotation in the counterclockwise direction in FIG. 2). With this rotation, the second pulley 26 and the O ring 25 rotate in the counterclockwise direction around the rotational center of the first pulley 24 and the O ring 25 abuts to the outer circumference surface of the outer ring 6 shown in FIG. 3. Then, rotation of the O ring 25 (reverse rotation) is transferred to the outer ring 6 and the outer ring 6 rotate relative to the inner ring 5 in the clockwise direction from the position shown in FIG. 10(A), via the position shown in FIG. 10(B) to the position shown in FIG. 10(C).

With this structure, the outer end 3d of each of the movable holding claws 3 abuts to the base end 12d of the corresponding lever 12 and the movable holding claw 3 moves to the release position as shown in FIG. 10(C) by the biasing force of the first spring 11. In this release position, the connecting part 15 is in the second position and each of the movable holding claws 3 is held in the release position by the connecting part 15.

Thus, the wafer 1 is transferred to the next step while the wafer 1 is released from support by the movable holding claws 3.

The thus-structured first embodiment exerts the following effects.

(1) The holding part 3a on the inner end side of each of the plural movable holding claws 3 holds the wafer 1 by abutting to the outer circumference of the wafer 1. When the notch detection sensor comprised of the light source 90 and the light receiving part 91 is used to detect the notch 1A (see FIG. 1), if the holding part 3a of any of the movable holding claws 3 abuts to the outer circumference of the wafer 1 at the notch 1A portion, the light from the light source is made to pass through the notch 1A into the light receiving part without being blocked by the holding part 3a. This makes it possible to prevent the notch 1A from being hidden from the movable holding claw 3 when it abuts to the outer circumference of the wafer 1 at the notch 1A portion, as compared with a slide arm, thereby to detect the notch 1A position with reliability.

(2) Even when the wafer 1 is held at a notch 1A portion, it is possible to eliminate the need to re-hold the wafer 1 or change the relative position of the holding parts 3a of the movable holding claws 3 thereby to shorten the processing time and to improve the throughput.

(3) As there is only a small area in the front surface and back surface of the wafer which is hidden by the holding part 3a of each of the plural movable holding claws 3, it is possible to use the cameras provided for image-taking the front and back surfaces of the wafer 1 to take images of both of the surfaces of the wafer 1 simultaneously.

(4) It is possible to rotate the plural movable holding claws 3 and the wafer 1 together with the center of the wafer 1 in the horizontal plane as a rotational center while the wafer 1 is held by the plural movable holding claws 3. This makes it possible to hold the wafer 1 by the movable holding claws 3 with reliability without undulation or deformation of the wafer 1 like in the vacuum attachment.

(5) As the wafer 1 is held by the concave surface 3b of the holding part 3a of each of the plural movable holding claws 3 abutting to the upper edge 1a and lower edge 1b of the outer circumference of the disk, it is possible for the holding part 3a to hold the wafer 1 with reliability.

(6) The movable claw driving part 2 moves each movable holding claw 3 between the holding position and the release position by rotating the inner ring 5 and the outer ring 6 relative to each other, the driving part of the movable claw driving part 2 can be placed outside the inner ring 5 and the outer ring 6. This makes it possible to hold and the wafer 1 without preventing the cameras from taking images of both surfaces of the wafer 1. That is, if the driving part for driving each of the movable holding claws 3 is provided on the movable part like the inner ring or outer ring (rotating side), there occur problems such as complicated wiring, kink or break in the wire and the like. In order to prevent these problems, it is required to rotate the disk back to the original state, that is, to put limitations on the rotation amount. The present invention makes it possible to realize a simple structure without such inconvenience.

(7) When the connecting part 15 is placed in the first position, the movable holding claws 3 are pressed by the one ends 12a of the respective levers 12 and held in the holding position. When the connecting part 15 is placed in the second position, the movable holding claws 3 are released from pressure of the one ends 12a of the respective levers 12 and held in the release position. With this structure, it is possible to hold the movable holding claws 3 in the holding position steadily when the connecting part 15 is placed in the first position and to hold the movable holding claws 3 in the release position steadily when the connecting part 15 is placed in the second position.

(8) During one turn of the movable holding claws 3 together with the inner ring 5 and the outer ring 6, the engaging surface 31a of the engaging member 31 engage with the opposite ends 12b of the respective levers 12 sequentially to release the pressure of the movable holding claws 3 by the respective levers 12 so that the movable holding claws 3 in the holding position are sequentially displaced to the release position. With this structure, when the front surface and back surface of the wafer 1 are image-taken by the cameras or when the edge upper part and edge lower part of the wafer 1 are image-taken by the edge detection sensors, it is possible to obtain image information of any cracks, scratches, adhesion of particles and the like in each of the parts of the wafer 1 held by the holding parts 3a of the plural movable holding claws 3 by the cameras. Further, for a wafer 1 having a small notch 1A (for example, the notch 1A is so small that the notch 1A is hidden behind the movable holding claws 3), even if a movable holding claw 3 abuts to the outer circumference of the wafer 1 at a notch 1A portion, the movable holding claw 3 is in the state of the release position, the light from the light source 90 is not blocked by the holding part 3a and made to pass through the notch 1A into the light receiving part 91. This structure makes it possible to detect the position of the notch 1A with reliability.

(9) The motor 23 of the relative rotation generating part 16 for generating relative rotation of the outer ring 8 and inner ring 5 is arranged outside the outer ring 6. When the driving part is arranged inside the rotating object there occur problems such as complicated wiring, kink or break in the wire and the like. In order to prevent these problems, it is required to rotate the disk back to the original state, that is to put limitations on the rotation amount. The present invention makes it possible to realize a simple structure without such inconvenience.

(10) As the wafer table 27 is provided for supporting the back surface of the wafer 1 which is to be transferred into the disk holding apparatus from the outside by a wafer transferring robot or the like, it is possible to move the plural movable holding claws 3 inwardly in the radial direction of the wafer 1 while the wafer 1 is supported by the wafer table 27 thereby to be able to hold the outer circumference of the wafer 1 by the holing parts 3a of the respective movable holding claws 3 with safety.

(11) As the four cameras 41 to 44 and the four cameras 51 to 54 are arranged to the front surface side and the back surface side of the wafer 1, respectively, it is possible to take images of the front surface and the back surface of the wafer simultaneously. In addition, the holding parts 3a of the movable holding claws 3 are abutted to the outer circumference of the wafer 1 to hold the wafer 1, it is possible to rotate the wafer 1 while holding the wafer 1 without preventing the cameras 41 to 44 and 51 to 54 from taking images of the both surfaces of the wafer 1. In addition, it is possible to shorten the time of taking image information of the both surfaces of the wafer 1 thereby to improve the throughput of the processing of detecting defect such as crack and scratch and adherences of particle and the like on the both surfaces of the wafer 1.

(12) As the edge detection sensors 97 and 98 are arranged on the front surface side and the back surface side, respectively, of the wafer 1, it is possible to take images of the edge upper part and the edge lower part simultaneously. Further, as the edge detection sensors 97 and 98 are used to take images of the edge upper part and the edge lower part, respectively, of the outer circumference of the wafer 1 held by the movable holding claws 3 while the movable holding claws 3 move to the release position, it is possible to make the edge detection sensors 97 and 98 take images of the edge upper part and the edge lower part of entire circumference of the wafer 1 while the wafer 1 is rotating. With this structure, it is possible to shorten the time of taking image information of the both surfaces of the wafer 1 thereby to improve the throughput of the processing of detecting defect such as crack and scratch and adherences of particle and the like on the both surfaces of the wafer 1 by the obtained image information.

Second Embodiment

Figure 13:
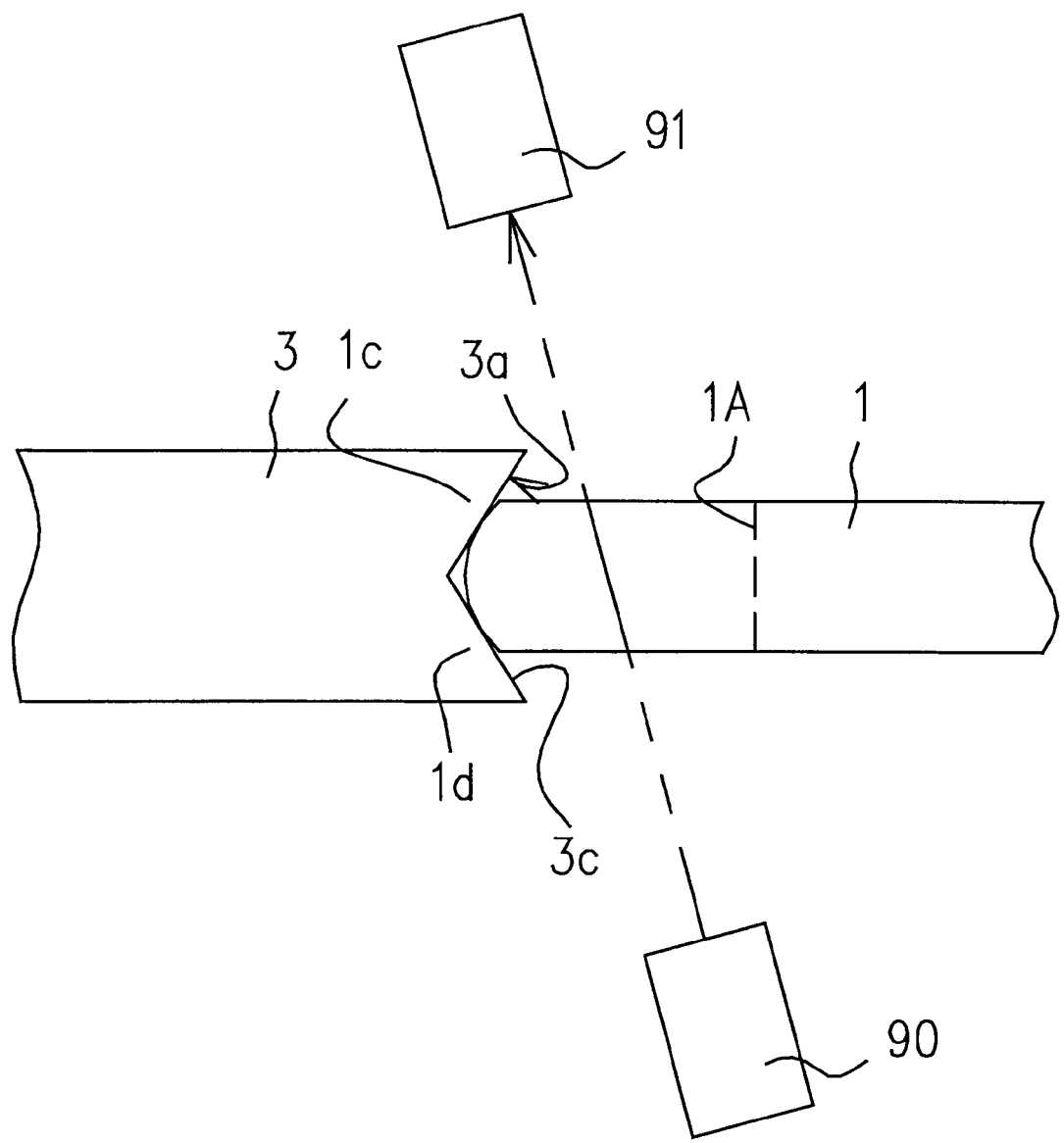
FIG. 13 is an explanatory view showing the outer circumference of the wafer held by the holding part of the movable holding claw in the disk holding apparatus according to the second embodiment.

Next description is made about a disk holding apparatus according to the second embodiment of the present invention and a defect/particle detecting apparatus provided therewith, with reference to FIG. 13.

The disk holding apparatus according to the second embodiment and the defect/particle detecting apparatus provided therewith are characterized in that the holding part 3a of each movable holding claw 3 is a V-shaped tapered surface 3c that abuts to the upper part 1c and lower part 1d of the outer circumference and the wafer 1.

As the V-shaped tapered surface 3c of each holding part 3a abuts to the upper part 1c and the lower part 1d of the disk to hold the disk, the disk can be held surely.

The thus-structured second embodiment exerts, besides the operational effects of the first embodiment, the operational effect of being able to hold the wafer 1 steadily as the V-shaped tapered surface of each holding part 3a abuts to the upper part 1c and lower part 1d of the outer circumference of the wafer 1.

Third Embodiment

Figure 14:
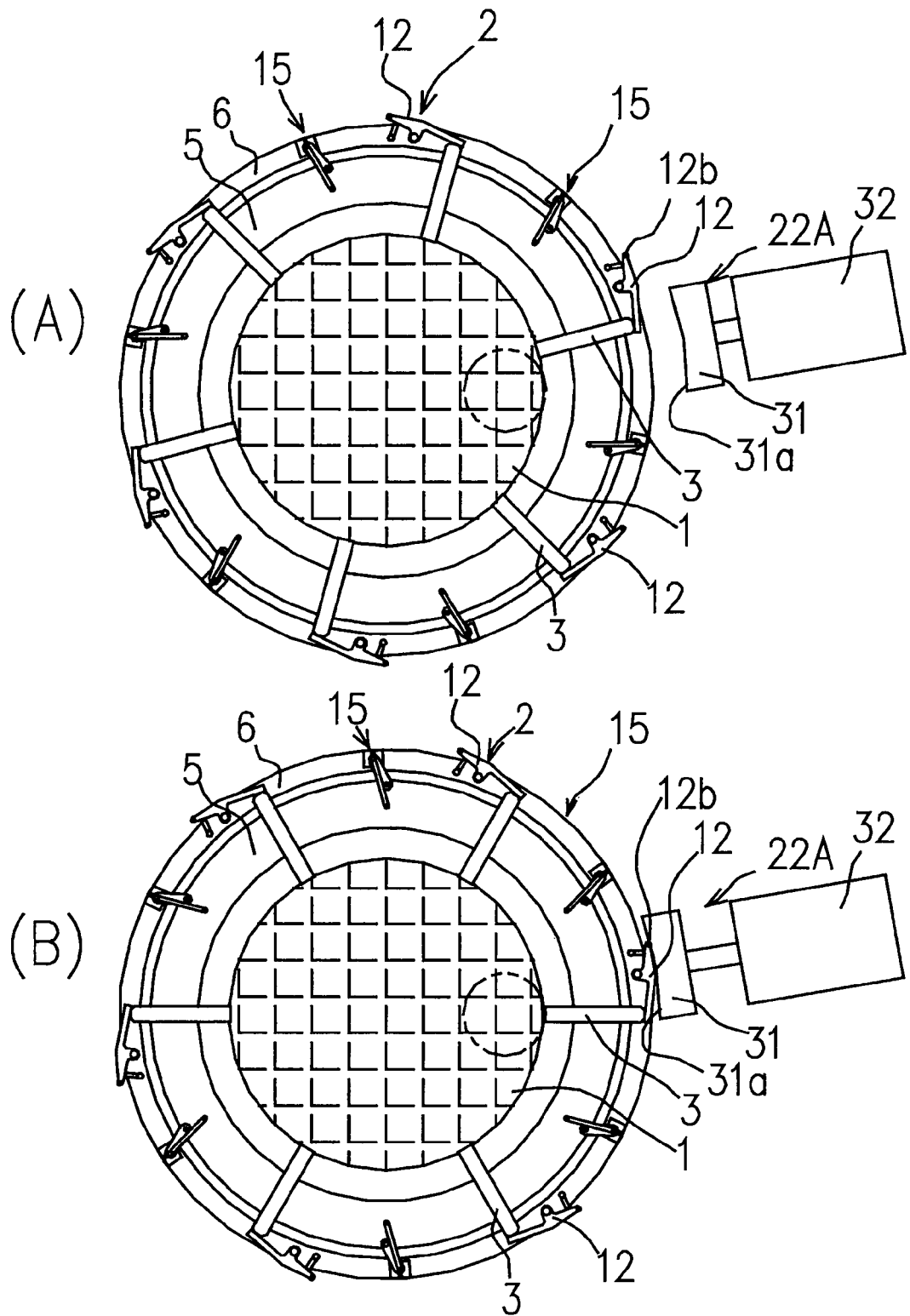
FIG. 14(A) is an operation explanatory view showing the release part goes away from the lever of the movable claw driving part in the disk holding apparatus according to a third embodiment.
FIG. 14(B) is an operation explanatory view showing the release part engaging with the lever.

Next description is made about a disk holding apparatus according to the third embodiment of the present invention and a defect/particle detecting apparatus provided therewith, with reference to FIGS. 14(A) and 14(B).

The disk holding apparatus according to the third embodiment and the defect/particle detecting apparatus provided therewith are characterized in that a release part 22A is provided in addition to the release part 22 in the first embodiment shown in FIGS. 9(A) and 9(B).

This release part 22A has an engaging member 31 and an air cylinder 32 for moving forward and backward the engaging member 31. With this release part 22, when the air cylinder 32 is used to displace the engaging member 31 from the save position shown in FIG. 14(A) to the engagement position shown in FIG. 14(B), the engagement surface 31a of the engaging member 31 is positioned in the rotation raceway of each end 12b of each lever 12. With this structure, while each movable holding claw 3 rotates together with the inner ring 5 and the outer ring 6, the engagement surface 31a of the engaging member 31 engages with the ends 12b of the levers 12 sequentially. Then, each lever 12 is rotated in the counterclockwise direction against the biasing force of the second spring 14 from the position shown in FIGS. 6 and 9(A) with the rotational center 12c as support point. Pressure of the movable holding claw 3 by each lever 12 is removed to displace the movable holding claw 3 at the holding position to the release position sequentially.

Fourth Embodiment

Figure 15:
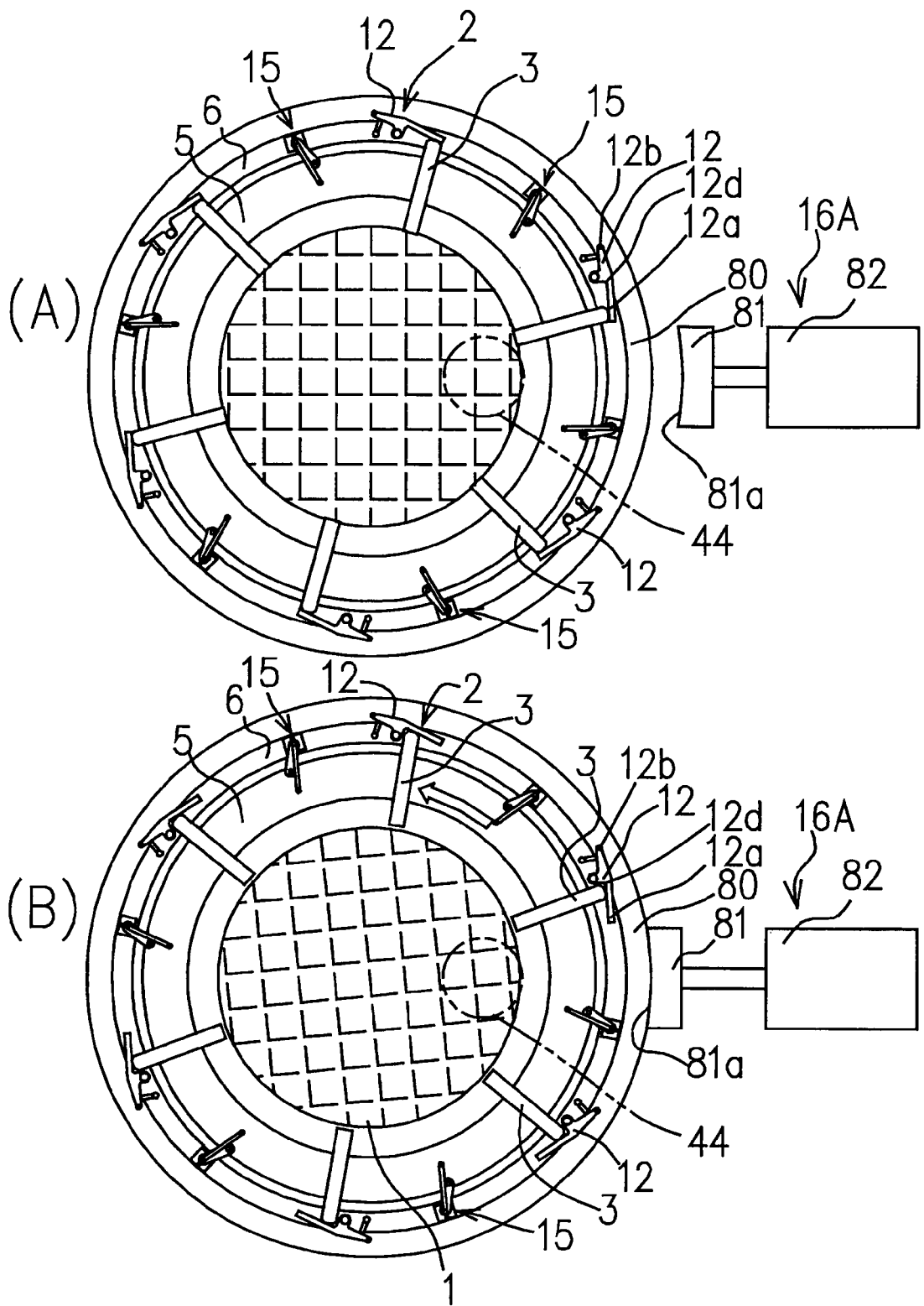
FIG. 15(A) is an operation explanatory view showing the release part goes away from the lever of the movable claw driving part in the disk holding apparatus according to a fourth embodiment.
FIG. 15(B) is an operation explanatory view showing the release part engaging with the lever.

Next description is made about a disk holding apparatus according to the fourth embodiment of the present invention and a defect/particle detecting apparatus provided therewith, with reference to FIGS. 15(A) and 15(B).

The disk holding apparatus according to the fourth embodiment and the defect/particle detecting apparatus provided therewith are characterized in that the relative rotation generating part 16 in the above-mentioned first embodiment is replaced with a relative rotation generating part 16.

This relative rotation generating part 16A has a ring 80 fixed to the outer circumference of the outer ring 6, an engaging member 81 abutting to the outer circumference surface of this ring 80 to fix the outer ring 6 and an air cylinder 82 for moving the engaging member 81 forward and backward.

The relative rotation generating part 16A displaces the engaging member 81 from the save position shown in FIG. 15(A) to the engaging position shown in FIG. 15(B) with use of the air cylinder 82 to fix the outer ring 6. In this state, the inner ring 5 is rotated relative to the outer ring 6 by rotating the motor 8 of the rotation driving part 7 in the forward or reverse direction to switch the movable holding claws 3 between the holding shown in FIG. 15(A) and the release position shown in FIG. 15(B).

While the movable holding claws 3 are held in the holding position as shown in FIG. 15(A), the air cylinder 82 is used to displace the engaging member 81 to the engaging position shown in FIG. 15(B). The engaging surface 81 of the engaging member 81 abuts to the outer circumference surface of the ring 80 thereby to fix the outer ring 6 (unrotatable). In this state, the motor 8 of the rotation driving part 7 is rotated in the reverse direction. Then, the inner ring 5 rotates relative to the outer ring 6 from the position shown in FIG. 15(A) in the counterclockwise direction to come into state as shown in FIG. 15(B). Then, the movable holding claws 3 are switched to the release position shown in FIG. 15(B) and held in this position.

Conversely, while the movable holding claws 3 are held in the release position as shown in FIG. 15(B), the air cylinder 82 is used to displace the engaging member 81 to the engaging position shown in FIG. 15(B) and the engaging surface 81a abuts to the outer circumference surface of the ring 80 thereby to fix the outer ring 6. In this state, the motor 8 of the rotation driving part 7 is rotated in the normal direction. Then, the inner ring 5 rotates relative to the outer ring 6 from the position shown in FIG. 15(B) in the clockwise direction to come into state as shown in FIG. 15(A). Then, the movable holding claws 3 are switched to the holding position shown in FIG. 15(A) and held in this position.

According to the thus-structured fourth embodiment, besides the operational effects of the above-mentioned first embodiment, the inner ring 5 is rotated relative to the outer ring 6 to use the motor 8 of the rotation driving part 7 as a driving source of the relative rotation generating part 16A for switching the plural movable holding claws 3 between the holding position and the release position, which eliminates the need of the driving source dedicated for the relative rotation generating part 16A. This exerts the operational effect of structure simplification and reduction of manufacturing cost.

Fifth Embodiment

Figure 16:
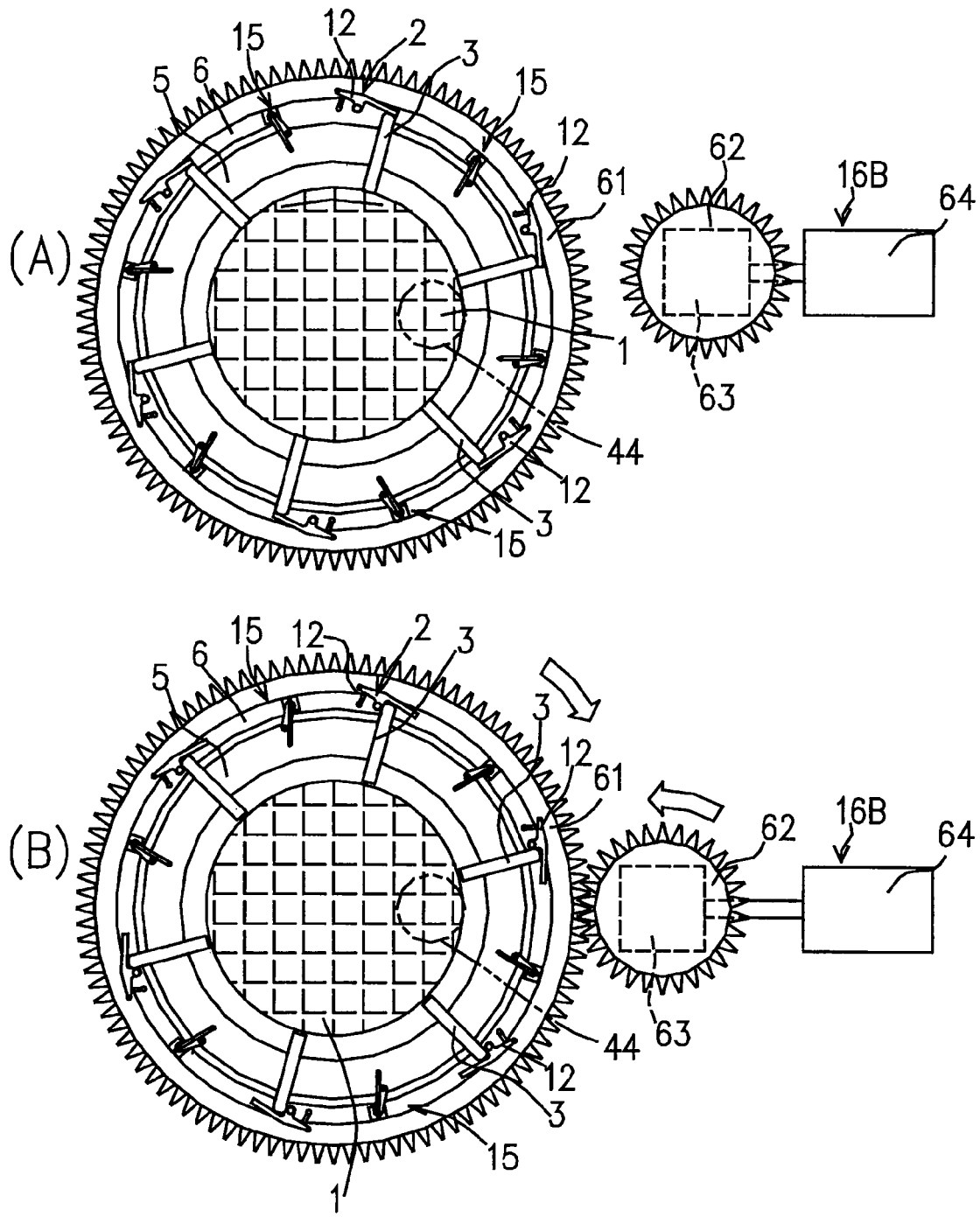
FIG. 16(A) is an operation explanatory view showing the no-operation state of the relative rotation generating part in the disk holding apparatus according to a fifth embodiment.
FIG. 16(B) is an operation explanatory view showing the operation state of the relative rotation generating part in the disk holding apparatus.

Next description is made about a disk holding apparatus according to the fifth embodiment of the present invention and a defect/particle detecting apparatus provided therewith, with reference to FIGS. 16(A) and 16(B).

The disk holding apparatus according to the fifth embodiment and the defect/particle detecting apparatus provided therewith are characterized in that the relative rotation generating part 16 according to the first embodiment is replaced with a relative rotation generating part 16B.

This relative rotation generating part 16B has a ring gear fixed to the fixed to the outer circumference of the outer ring 6, a gear 62 engaging with this ring gear 61, a motor 63 provided movable with this gear 62 for rotating the gear 62 in the normal and reverse directions and an air cylinder 64 for moving the gear 62 and the motor 63 forward and backward.

The relative rotation generating part 16B uses the air cylinder 64 to displace the gear 62 and the motor 63 from the save position shown in FIG. 16(A) to the engaging position shown in FIG. 16(B) by operating the motor 63 to rotate the gear 62 in the normal or reverse direction.

While the movable holding claws 3 are held in the holding position as shown in FIG. 16(A), the motor 63 is used to rotate the gear 62 in the reverse direction (counterclockwise direction) to displace the gear 62 and the motor 63 to the engaging position shown in FIG. 16(B) by the air cylinder 64. Then, the gear 62 engages with the ring gear 61. With this engagement, the ring gear 61 rotates from the position shown in FIG. 16(A) in the clockwise direction and the outer ring 6, which is integral with the ring gear 61, rotates relative to the inner ring 5 in the clockwise direction to the position shown in FIG. 16(B). Then, the movable holding claws 3 are switched to the release position shown in FIG. 16(B) and held in this position.

Conversely, while the movable holding claws 3 are held in the holding position as shown in FIG. 16(B), the motor 63 is used to rotate the gear 62 in the normal direction (clockwise direction) to displace the gear 62 and the motor 63 to the engaging position shown in FIG. 16(B) by the air cylinder 64. Then, the gear 62 engages with the ring gear 61. With this engagement, the ring gear 61 rotates from the position shown in FIG. 16(B) in the counterclockwise direction and the outer ring 6 rotates relative to the inner ring 5 in the counterclockwise direction to the position shown in FIG. 16(A) Then, the movable holding claws 3 are switched to the holding position shown in FIG. 16(A) and held in this position.

The thus-structured fifth embodiment exerts, besides the operational effects of the first embodiment, the operational effect of being able to make the gear 62 engage with the ring gear 61 surely as the air cylinder 64 is used to displace the gear 62 and the motor 63 from the save position shown in FIG. 16(A) to the engaging position shown in FIG. 16(B) while the motor 63 of the relative rotation generating part 16B is used to rotate the gear 62 in the normal or reverse direction.

Sixth Embodiment

Figure 17:
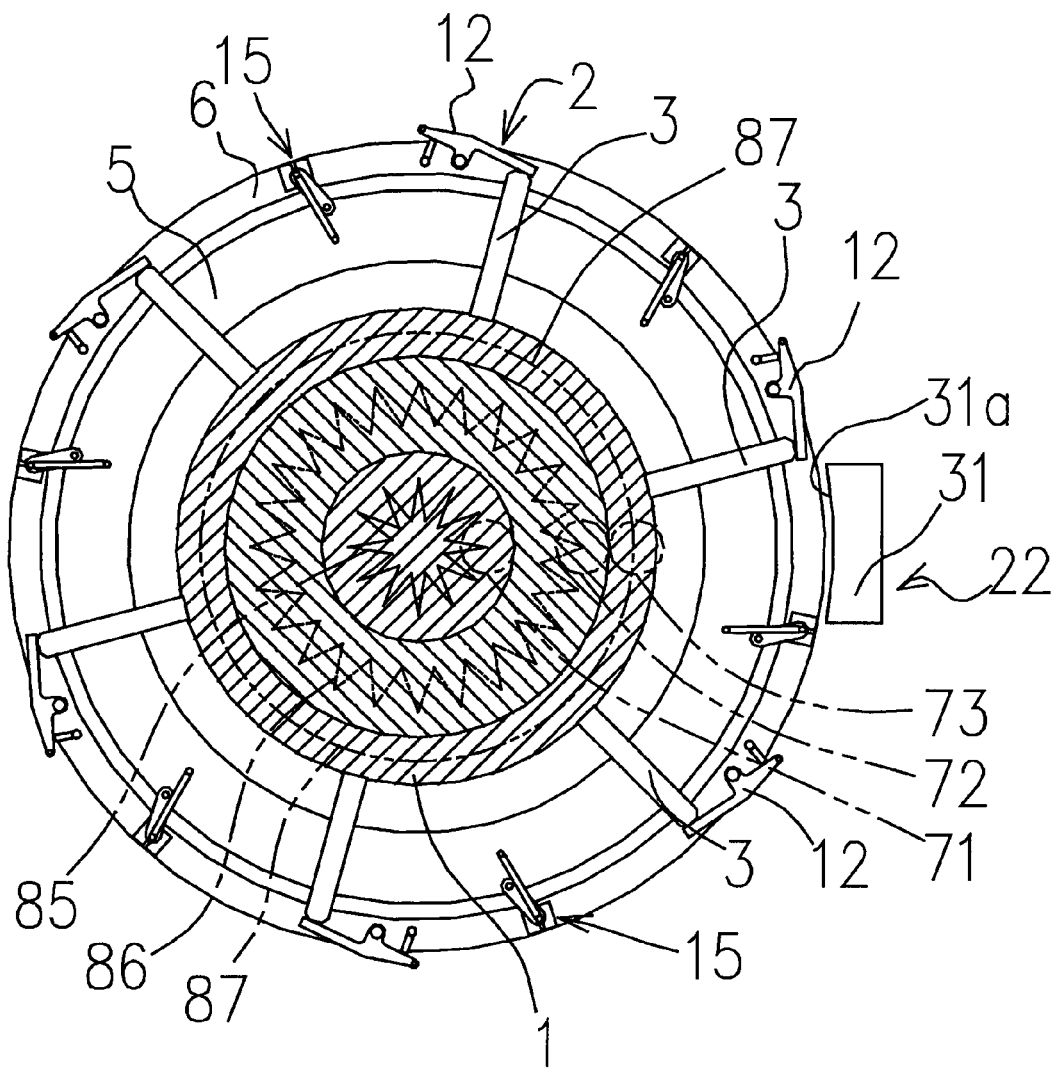
FIG. 17 is an explanatory view showing the wafer held by the plural movable holding claws is rotated and the front surface of the wafer is image-taken by three cameras in the disk holding apparatus according to the sixth embodiment.

Next description is made about a disk holding apparatus according to the sixth embodiment of the present invention and a defect/particle detecting apparatus provided therewith, with reference to FIG. 17.

The disk holding apparatus according to the sixth embodiment and the defect/particle detecting apparatus provided therewith has three cameras 71 to 73 for taking images of the front surface of the wafer 1 and three cameras (not shown) taking images of the back surface of the wafer 1 instead of the four cameras 41 to 44 and four cameras 51 to 54 for taking images of the front surface and the back surface, respectively of the wafer 1.

This disk holding apparatus and the defect/particle detecting apparatus provided with the disk holding apparatus are characterized by a way of moving the three cameras 71 to 73 for taking images of the front surface of the wafer 1 and three cameras for taking images of the back surface during one turn of the wafer 1.

Specifically, in order that the image-taken areas of the three cameras 71 to 73 for image-taking the front surface are approximately equal to each other, the camera 71 moves in the radial direction to follow the track 85, the camera 72 moves in the radial direction to follow the track 86 and the camera is fixed to follow the track 87. The camera 73 takes image of the outermost band area of the wafer 1. The three cameras for taking images of the back surface are moved in the same way as the three cameras 71 to 73 taking images of the front surface.

According to the thus-structured sixth embodiment, the cameras 71 to 73 are moved (though the camera 71 is fixed) so that the image-taken areas of the three cameras 71 to 73 for image-taking the front surface are almost equal to each other and the three cameras for image-taking the back surface are also moved in the same way as the three cameras for image-taking the front surface. Hence, the sixth embodiment exerts, besides the operational effects of the first embodiment, the operational effect of being able to make the information amount of images taken by the respective cameras almost equal thereby to increase processing speed of the image information and improve the throughput.

Here, the present invention may be embodied with modifications as follows.

Although the plural cameras are used to obtain information of the front and back surfaces of a wafer in the above-described embodiments, optical character readers (OCR) or the like may be provided instead of or in addition to the plural cameras to obtain ID information of the wafer front and back surfaces.

The invention claimed is:

1. A disk holding apparatus comprising:
   a plurality of movable holding claws arranged uniformly spaced in a circumferential direction of a disk having a notch therein, each of the movable holding claws having a holding part formed at one end thereof so as to abut an outer circumference of the disk;
   a movable claw driving unit that moves each of the movable holding claws, respectively, in a radial direction that passes through a center of the disk, the movable holding claws being moved between a holding position where the holding part of the movable holding claw abuts the outer circumference of the disk and a release position where the holding part is separated from the outer circumference of the disk;
   an inner ring on which the movable holding claws are supported; and
   an outer ring secured to the inner ring,
   wherein the movable holding claws are biased outwardly in the radial direction by a first spring, and
   wherein the movable claw driving unit includes
      a lever rotatably supported on the outer ring such that a first end of the lever abuts an outer end of a corresponding one of the movable holding claws,
      a second spring disposed between a second end of the lever and a fixation pin provided on the outer ring, the second spring biasing the movable holding claw inwardly in the radial direction by a biasing force stronger than a biasing force of the first spring,
      a connecting unit that connects the inner ring and the outer ring and controls a relative rotation angle of the inner ring and the outer ring; and
   a relative rotation generating unit that rotates the inner ring and the outer ring relative to each other.

2. The disk holding apparatus of claim 1, wherein the holding part of each of the movable holding claws is shaped such that, while the holding part abuts the outer circumference of the disk and the disk is held by the movable holding claws, the disk is held in a horizontal plane and the center of the disk aligns with a rotational center of the disk.

3. The disk holding apparatus of claim 1, wherein the holding part of each of the movable holding claws has a concave surface abutting an upper edge and a lower edge of the outer circumference of the disk.

4. The disk holding apparatus of claim 1, wherein the holding part of each of the movable holding claws has a V-shaped tapered surface abutting an upper part and a lower part of the outer circumference of the disk.

5. The disk holding apparatus of claim 1, wherein the inner ring is rotatably supported by a board,
   wherein the disk holding apparatus further comprises a rotation driving unit that rotates the inner ring, and
   wherein the movable claw driving unit rotates the outer ring relative to the inner ring in normal and reverse directions so that each of the movable holding claws moves between the holding position and the release position.

6. The disk holding apparatus of claim 5, wherein the rotation driving unit includes
   a driving source,
   a pulley rotatably supported by the board and fixed to the inner ring, and
   a belt that transfers rotation of the driving source to the pulley.

7. The disk holding apparatus of claim 1, wherein the connecting unit controls the relative rotation angle for rotating the inner ring and the outer ring relative to each other between a first position where the first end of the lever presses the movable holding claw so as to hold the movable holding claw at the holding position and a second position where pressure of the movable holding claw by the first end of the lever is released so as to hold the movable holding claw at the release position.

8. The disk holding apparatus of claim 7, wherein the connecting unit includes
   a connecting lever rotatably supported by the inner ring,
   a rotation transferring member provided on the outer ring, the rotation transferring member engaging with the connecting lever so as to transfer normal rotation and reverse rotation of the outer ring relative to the inner ring to the connecting lever, and
   a third spring provided between a tip end of the connecting lever and a fixation pin disposed on the inner ring, the third spring creating a force so as to assist in rotating the connecting lever between a first position and a second position with a dead position as a rotational center.

9. The disk holding apparatus of claim 1, further comprising:
   a plurality of levers rotatably supported on the outer ring; and
   a release unit that, during one turn of the movable holding claws together with the inner ring and the outer ring while the disk is held by the movable holding claws abutting the outer circumference of the disk, engages with the levers one after another to release pressure of the movable holding claws by the levers and displace the movable holding claws from the holding position to the release position sequentially.

10. The disk holding apparatus of claim 1, wherein the relative rotation generating unit includes
a driving source arranged around the outer ring, and
a friction belt that is rotated by a driving force of the driving source, the friction belt being brought into contact with an outer circumference of the outer ring to rotate the outer ring relative to the inner ring in normal and reverse directions.

11. The disk holding apparatus of claim 1, wherein the relative rotation generating unit includes
a driving source arranged around the outer ring,
a gear that is rotated by driving the driving source, and
a ring gear fixed to an outer circumference of the outer ring, the gear being engaged with the ring gear to rotate the outer ring relative to the inner ring in normal and reverse directions.

12. The disk holding apparatus of claim 1, further comprising a wafer table movable upward and downward between a support position for supporting a back surface of the disk transferred from outside and a save position positioned thereebeneath.

13. A defect/particle detecting apparatus comprising:
the disk holding apparatus of claim 1;
a plurality of cameras arranged at positions so as to capture images of a front surface and a back surface of the disk; and
a detecting part that uses image information captured by the cameras to detect any defect or adhesion of a particle on the front surface and the back surface of the disk.

14. The defect/particle detecting apparatus of claim 13, further comprising:
first and second edge detecting units that capture images of an outer circumference of the disk,
wherein the detecting part further uses image information of an upper edge and an upper part of the outer circumference of the disk captured by the first edge detecting unit, which is arranged at a front surface side, and image information of a lower edge and a lower part of the outer circumference of the disk captured by the second edge detecting unit, which is arranged at a back surface side, to detect any defect or adhesion of a particle on the outer circumference of the disk.

15. An apparatus comprising:
an inner ring having a central axis therethrough;
an outer ring secured to the inner ring such that a central axis of the outer ring is coaxial with the central axis of the inner ring;
a plurality of holding claws supported on the inner ring and uniformly spaced in a circumferential direction of the inner ring, a length of each of the holding claws extending in a direction toward the central axis of the inner ring, an end of each of the holding claws having a holding part, and the holding part being concave such that the holding part opens toward the central axis of the inner ring; and
a claw driving unit that moves each of the holding claws, respectively, in a radial direction that passes through the central axis of the inner ring, the holding claws being moved between a holding position and a release position such that the holding part is located closer to the central axis of the inner ring in the holding position than when in the release position,
wherein the movable holding claws are biased outwardly in the radial direction by a first spring, and
wherein the movable claw driving unit includes
a lever rotatably supported on the outer ring such that a first end of the lever abuts an outer end of a corresponding one of the movable holding claws,
a second spring disposed between a second end of the lever and a fixation pin provided on the outer ring, the second spring biasing the movable holding claw inwardly in the radial direction by a biasing force stronger than a biasing force of the first spring,
a connecting unit that connects the inner ring and the outer ring and controls a relative rotation angle of the inner ring and the outer ring; and
a relative rotation generating unit that rotates the inner ring and the outer ring relative to each other.

* * * * *